(12) United States Patent
Kane et al.

(10) Patent No.: US 11,322,702 B1
(45) Date of Patent: May 3, 2022

(54) ELECTRICAL DEVICES HAVING RADIOFREQUENCY FIELD EFFECT TRANSISTORS AND THE MANUFACTURE THEREOF

(71) Applicant: Carbonics Inc., Culver City, CA (US)

(72) Inventors: Alexander Allen Kane, Culver City, CA (US); Christopher Michael Rutherglen, Culver City, CA (US); Tyler Andrew Cain, Culver City, CA (US); Philbert Francis Marsh, Culver City, CA (US); Kosmas Galatsis, Culver City, CA (US)

(73) Assignee: Carbonics Inc., Culver City, CA (US)

( * ) Notice: Subject to any disclaimer, the term of this patent is extended or adjusted under 35 U.S.C. 154(b) by 72 days.

(21) Appl. No.: 17/034,933

(22) Filed: Sep. 28, 2020

Related U.S. Application Data

(62) Division of application No. 16/431,359, filed on Jun. 4, 2019, now Pat. No. 10,833,284.

(51) Int. Cl.
*H01L 51/05* (2006.01)
*C01B 32/158* (2017.01)
(Continued)

(52) U.S. Cl.
CPC ........ *H01L 51/0558* (2013.01); *C01B 32/158* (2017.08); *H01L 51/0003* (2013.01);
(Continued)

(58) Field of Classification Search
CPC ......... H01L 2924/13–13061; H01L 29/66439; H01L 29/66462; H01L 29/66469;
(Continued)

(56) References Cited

U.S. PATENT DOCUMENTS 8,860,137 B2 * 10/2014 Zhou .................. B82Y 10/00
438/197
9,728,734 B2   8/2017 Arnold et al.
(Continued)

OTHER PUBLICATIONS

Guo, et al.; "Record Maximum Oscillation Frequency in C-Face Epitaxial Graphene Transistors"; NANO Letters; pubs.acs.org/NanoLett; ACS Publications; American Chemical Society; Oct. 16, 2012; pp. 942-947.
(Continued)

*Primary Examiner* — Sonya McCall-Shepard

(57) ABSTRACT

Electrical device including a substrate having a surface and a radiofrequency field effect transistor (RF-FET) on the substrate surface. RF-FET includes a CNT layer on the substrate surface, the CNT layer including electrically conductive aligned carbon nanotubes, and pin-down anchor layers on the CNT layer. A first portion of the CNT layer, located in-between the pin-down anchor layers, is not covered by the pin-down anchor layers and is a channel region of the radiofrequency field effect transistor and second portions of the CNT layer are covered by the pin-down anchor layers. For cross-sections in a direction perpendicular to a common alignment direction of the aligned CNTs in the first portion of the CNT layer: the aligned CNTs have an average linear density in a range from 20 to 120 nanotubes per micron along the cross-section, and at least 40 percent of the aligned CNTs are discrete from any CNTs of the CNT layer.

19 Claims, 27 Drawing Sheets

Figure 1:
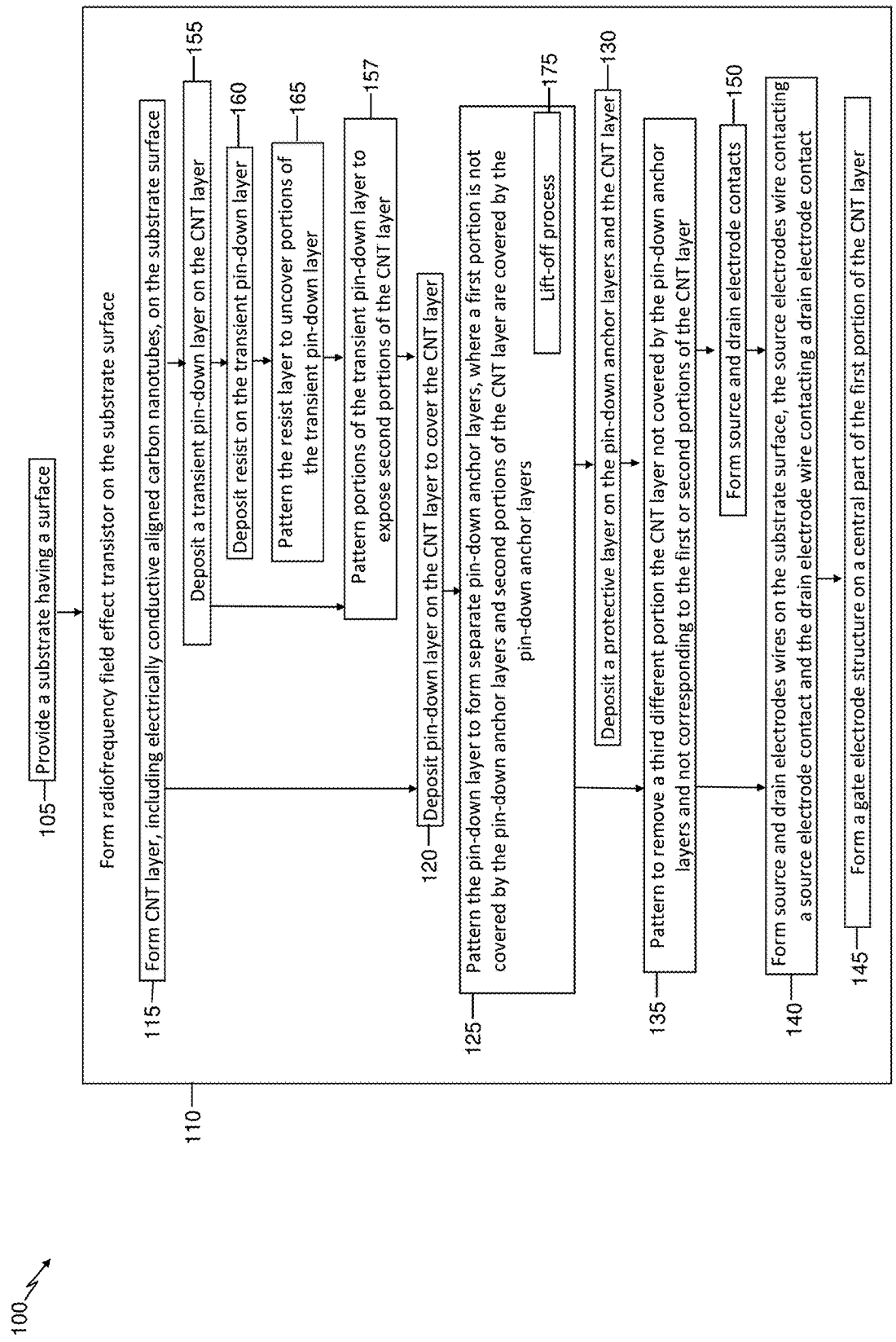

(51) Int. Cl.
   *H01L 51/00* (2006.01)
   *H01L 21/02* (2006.01)
   *H01L 29/06* (2006.01)

(52) U.S. Cl.
   CPC .... *H01L 51/0048* (2013.01); *H01L 21/02606* (2013.01); *H01L 29/0665* (2013.01); *H01L 2924/13* (2013.01)

(58) Field of Classification Search
   CPC ......... H01L 29/78687; H01L 29/78696; H01L 21/02606; H01L 31/035227; H01L 51/0045–0048; H01L 29/0669–068; H01L 51/05; H01L 21/823412; H01L 21/823807; H01L 51/057; H01L 29/0665–0676; H01L 51/0558; H01L 51/10–107; Y10S 977/938; C01B 2202/00; C01B 2202/08; C01B 2202/22; C01B 2202/32; C01B 2202/20; C01B 32/158
   See application file for complete search history.

(56) References Cited

U.S. PATENT DOCUMENTS

| | | | |
|---|---|---|---|
| 10,074,819 B2 | 9/2018 | Arnold et al. | |
| 2005/0056825 A1 | 3/2005 | Bertin et al. | |
| 2008/0296563 A1* | 12/2008 | Bourgoin | H01L 51/0003 257/E51.012 |
| 2021/0284538 A1* | 9/2021 | Peddini | C08K 3/041 |

OTHER PUBLICATIONS

Han, et al.; "Graphene radio frequency receiver integrated circuit"; nature Communications; 10.1038/ncomms4086; Oct. 2, 2013; pp. 1-6.

Wei, et al.; "High frequency and noise performance of GFETs"; IC Noise Fluctuat; 2017; 5 pgs.

Mistry, et al.; "High-Yield Dispersions of Large-Diameter Semiconducting Single-Walled Carbon Nanotubes with Turnable Narrow Chirality Distributions"; ACSNANO, vol. 7, No. 3; www.acsnano.org; 2013; pp. 2231-2239.

Javey, et al.; "Self-Aligned Ballistic Molecular Transistors and electrically Parallel Nanotube Arrays"; Nano Letters, vol. 4, No. 7; May 24, 2004; pp. 1319-1322.

Jinkins, et al.; "Nanotube Alignment Mechanism in floating Evaporative Self-Assembly"; Langmuir; pubs.acs.org/Langmuir; ACS Publications; American Chemical Society; Aug. 10, 2017; pp. 13407-13414.

Jo, et al.; "Lg=25 nm InGaAs/InAlSs high-electron mobility transistors with both fT and fmax in excess of 700 GHz" The Japan Society of Applied Physics; Applied Physics Express 12, 054006; https://doi.org/10.7567/1882-0786/ab1943; 2019; 5 pgs.

Kim, et al.; "Hysteresis Caused by Water Molecules in Carbon Nanotube Field-Effect Transistors"; Nano Letters, vol. 3, No. 2; Nov. 29, 2002; pp. 193-198.

Kingrey, et al.; "Electronic Fluctuations in Nanotube Circuits and Their Sensitivity to Gases and Liquids"; Nano Letters, vol. 6, No. 7; American Chemical Society; Jan. 10, 2006; pp. 1564-1568.

Kocabas, et al.; "Radio frequency analog electronics based on carbon nanotube transistors"; Applied Physical Sciences; www.pnas.org/cgi/doi/10.1073/pnas.0709734105; vol. 105, No. 5; Feb. 5, 2008; pp. 1405-1409.

Kocabas, et al.; "High-Frequency Performance of Submicrometer Transistors That Use Aligned Arrays of Single-Walled Carbon Nanotubes"; Nano Letters, vol. 9, No. 5; American Chemical Society; Jan. 13, 2009; pp. 1937-1943.

LeLouarn, et al.; "Intrinsic current gain cutoff frequency of 30 GHz with carbon nanotube transistors"; Applied Physics Letters 90, 233108; American Institute of Physics; Jan. 24, 2007; 4 pgs.

Lee, et al.; "Suppression of resist contamination during photolithography on carbon nanomaterials by a sacrificial layer"; Elsevier; www.elsevier.com/locate/carbon; Carbon 66; ScienceDirect; www.sciencedirect.com; 2014; pp. 295-301.

Liao, et al.; "Avalanche-Induced Current Enhancement in Semiconducting Carbon Nanotubes"; Physical Review Letters, PRL 101, 256804; The American Physical Society; Aug. 8, 2008; 4 pgs.

Liu, et al.; "Improving non-suspended carbon nanotube FET performance by using an alumina protective layer" Elsevier; www.elsevier.com/locate/snb; Sensors and Actuators B 198; ScienceDirect; Sep. 14, 2013; pp. 479-486.

Liu, et al.; "Scaling down contact length in complementary carbon nanotube field-effect transistors"; Royal Society of Chemistry; Nanoscale; May 7, 2017; pp. 9615-9621.

Mothes, et al.; "Toward Linearity in Schottky Barrier CNTFETs"; IEEE Transactions on Nanotechnology, vol. 14, No. Mar. 2, 2015; pp. 372-378.

Mothes, et al.; "Three-dimensional transport simulations and modeling of densely packed CNTFETs"; IEEE Transactions on Nanotechnology; DOI 10.1109/TNANO.2018.2874109; http://www.ieee.org/publications_standards/publications/rights/index.html; 2018; pp. 1-7.

Bessemoulin, et al.; "0.1-µm GaAs PHEMT W-Band Low Noise Amplifier MMIC using Coplanar Waveguide Technology"; 1st Australian Microwave Symposium (AMS); IEEE; 2014; pp. 1-2.

Ozaki, et al.; "Reduction in current collapse of AlGaN/GaN HEMTs using methyl silsesquioxane-based low-k insulator films"; Physica Status Solidi A 212, No. 5, www.pss-a.com; Sep. 10, 2014; pp. 1153-1157.

Park, et al.; "Hysteresis in Carbon Nanotube Transistors: Measurement and Analysis of Trap Density, Energy Level, and Spatial Distribution"; ACSNano; www.acsnano.org; American Chemical Society; ACS Publications; Feb. 1, 2016; 10 pgs.

Park, et al.; "Hysteresis-Free Carbon Nanotube Field-Effect Transistors"; ACSNano; www.acsnano.org; ACS Publications; American Chemical Society; Feb. 19, 2017; 7 pgs.

Pitner, et al.; "Low-Temperature Side Contact to Carbon Nanotube Transistors: Resistance Distributions Down to 10 nm Contact Length"; NANO Letters; pubs.acs.org/NanoLett; ACS Publications; American Chemical Society; Oct. 30, 2018; pp. 1083-1089.

Soorapanth, et al.; "RF Linearity of Short-Channel MOSFETs"; Center for Integrated Systems, Stanford University; 1998; pp. 1-4.

Rutherglen, et al.; "Nanotube electronics for radiofrequency applications"; Nature Nanotechnology, vol. 4; Nov. 29, 2009; pp. 811-819.

Ding, et al.; "Self-Aligned U-Gate Carbon Nanotube Field-Effect Transistor with Extremely Small Parasitic Capacitance and Frain-Induced Barrier Lowering"; ACSNano, vol. 5, No. 4; www.acsnano.org; Aug. 19, 2010; pp. 2512-2519.

Choi, et al.; "Short-Channel Transistors Constructed with Solution-Processed Carbon Nanotubes"; ACSNano, vol. 7, No. 1; www.acsnano.org; Nov. 13, 2012; pp. 798-803.

Park, et al.; Supporting Information to "Hysteresis-Free Carbon Nanotube Field-Effect Transistors"; 2017; 5 pgs.

Jinkins, et al.; Supporting Information to "Nanotube Alignment Mechanism in Floating Evaporative Self-Assembly" 2017; 14 pgs.

Brady, et al.; Supporting Information to "Polyfluorene-Sorted, Carbon Nanotube Array Field-Effect Transistors with Increased Current Density and High On/Off Ratio"; 2014; 12 pgs.

Che, et al.; Supporting Information for "Self-Aligned T-gate High-Purity Semiconducting Carbon Nanotube RF Transistors Operated in Quasi Ballistic Transport and Quantum Capacitance Regime"; 2012; 5 pgs.

Brady, et al.; Supporting Information for "Channel length scaling behavior in transistors based on individual versus dense arrays of carbon nanotubes"; 2017; 5 pgs.

Steiner, et al.; "High-frequency performance of scaled carbon nanotube array field-effect transistors"; Applied Physics Letters 101, 053123; American Institute of Physics; Apr. 17, 2012; 5 pgs.

Zhuravlev; "The surface chemistry of amorphous silica. Zhuravlev model"; Elsevier; www.elsevier.nl/locate/colsurfa; Colloids and Services A: Physicochemical and Engineering Aspects 173; Jan. 14, 1999; pp. 1-38.

(56) References Cited

OTHER PUBLICATIONS

Wang, et al.; "Radio Frequency and Linearity Performance of Transistors Using High-Purity Semiconducting Carbon Nanotubes"; ACSNano, vol. 5, No. 5; www.acsnano.org; Mar. 10, 2011; pp. 4169-4176.

Wang, et al.; "Scalable Fabrication of Ambipolar Transistors and Radio-Frequency Circuits Using Aligned Carbon Nanotube Arrays"; Materials Views; www.MaterialsViews.com; Advanced Materials; www.advmat.de; 2014; pp. 645-652.

Yu, et al.; "Improvement of the Frequency Characteristics of Graphene Field-Effect Transistors on SiC Substrate" IEEE Electron Device Letters, vol. 38, No. 9; Sep. 2017; pp. 1339-1342.

Joo, et al.; "Dose-Controlled, Floating Evaporative Self-assembly and Alignment of Semiconducting Carbon Nanotubes from Organic Solvents"; Department of Materials Science and Engineering, University of Wisconsin; Langmuir; 2014; 30(12); ACS Publications; pubs.acs.org/Langmuir; American Chemical Society; 14 pgs.

Liu, et al.; "Enabling fabrication of clean electrical contacts to carbon nanotubes using oxygen plasma ashing"; PSS; www.pss-b.com; 253, No. 12; Jun. 27, 2016; pp. 2417-2423.

Lee, et al.; "Suppression of resist contamination during photolithography on carbon nanomaterials by a sacrificial layer"; Carbon 66; Elsevier; www.eisevier.com/locate/carbon; SinceDirect; www.sciencedirect.com; 2014; pp. 295-301.

Cao, et al.; "Radio Frequency Transistors Using Aligned Semiconducting Carbon Nanotubes with Current-Gain Cutoff Frequency and Maximum Oscillation Frequency Simultaneously Greater than 70 GHz"; ACS Nano; www. acsnano.org American Chemical Society; Jun. 14, 2016; 14 pgs.

Brady, et al.; "Quasi-ballistic carbon nanotube array transistors with current density exceeding Si and GaAs"; Science Advances; htts://advances.sciencemag.org; 2016; 29 pgs.

Brady, et al.; "Polyfluorene-Sorted, Carbon Nanotube Array Field-Effect Transistor with Increased Current Density and High On/Off Ratio"; ACS Nano; www.acsnano.org; American Chemical Society; Nov. 10, 2014; 20 pgs.

Brady, et al.; "High performance transistors via aligned polyfluorene-sorted carbon nanotubes"; Applied Physics Letters 104; Department of Materials Science and Engineering, University of Wisconsin-Madison; 2014; 6 pgs.

Cao, et al.; "Carbon nanotube transistors scaled to a 40-nanometer footprint"; Science 356; http://science.sciencemag.org; 2017; 27 pgs.

Hsu, et al.; "Impact of Graphene Interface Quality on Contact Resistance and RF Device Performance"; IEEE Electron Device Letters; vol. 32, No. 8; Aug. 2011; pp. 1008-1010.

Wu, et al.; "200 GHz Maximum Oscillation Frequency in CVD Graphene Radio Frequency Transistors"; ACS Applied Materials & Interfaces; www.acasmi.org; American Chemical Society; 2016; pp. 25645-25649.

Wang, et al.; "Reducing graphene device variability with yttrium sacrificial layers"; Applied Physics Letters 110, 223106; 2017; 6 pgs.

Javey, et al.; "Ballistic carbon nanotube field-effect transistors"; Nature Publishing Group; Nature, vol. 424; www.nature.com/nature; Aug. 7, 2003; pp. 654-657.

Burke; "AC performance of nanoelectronics: towards a ballistic THz nanotube transistor"; Elsevier; www.elsevier.com/locate/sse; Science Direct; www.sciencedirect.com; Solid-State electronics 48; Dec. 10, 2003; pp. 1981-1986.

Deng, et al.; "Modeling and Analysis of Planar-Gate Electrostatic Capacitance of 1-D FET With Multiple Cylindrical Conducting Channels"; IEEE Transactions on Electron Devices, vol. 54, No. 9; Sep. 2007; pp. 2377-2385.

Schwierz, et al.; "RF transistors: Recent developments and roadmap toward terahertz applications"; Elsevier; www.elsevier.com/locate/sse; ScienceDirect; www.sciencedirect.com; Solid-State Eectronics 51; Aug. 2, 2006; pp. 1079-1091.

Eron, et al.; "L-band carbon nanotube transistor amplifier"; Electronics Letters, vol. 47, No. 4; Feb. 17, 2011; 2 pgs.

Jin, et al.; "Sources of Hysteresis in Carbon Nanotube Field-Effect Transistors and Their Elimination Via Methylsiloxane Encapsulants and Optimized Growth Procedures"; Advanced Functional Materials; www.afm-journal.de' Materials Views; www.MaterialsViews.com;wileyonlinelibrary.com; 2012; pp. 2276-2284.

Schwierz; "Graphene Transistors: Status, Prospects, and Problems"; vol. 101, No. 7, Proceedings of the IEEE; Jul. 2013; pp. 1567-1584.

Brady, et al.; "Polyfluorence-Sorted, Carbon Nanotube Array Field-Effect Transistors with Increased Current Density and High On/Off Ratio"; American Chemical Society; ACSNANO; www.acsnano.org; Aug. 29, 2014; 20 pgs.

Cao, et al.; "Radio frequency transistors based on ultra-high purity semiconducting carbon nanotubes with superior extrinsic maximum oscillation frequency"; Nano Research DOI 10.1007/s12274-015-0915-7; Aug. 6, 2015; 12 pgs.

Graf, et al.; "Large scale, selective dispersion of long single-walled carbon nanotubes with high photoluminescence quantum yield by shear force mixing"; ScienceDirect; Carbon; Elsevier; www.elsevier.com/locate/carbon; http://dx.doi.org/10.1016/j.carbon.2016.05.002; Mar. 13, 2016; pp. 593-599.

Kanimozhi, et al.; "Structurally Analogous Degradable Version of Fluorene-bipyridine Copolymer with Exceptional Selectivity for Large Diameter Semiconducting Carbon Nanotubes"; ACS Applied Materials & Interfaces; UCLA Library; Oct. 25, 2017; 26 pgs.

Chortos, et al.; "Supplementary Information for Universal Selective Dispersion of Semiconducting Carbon Nanotubes from Commercial Sources Using a Supramolecular Polymer"; Undated; 16 pgs.

Maas; "Linearity and Dynamic Range of Carbon Nanotube Field-Effect Transistors"; Nonlinear Technologies, Inc. IEEE; 2017; pp. 87-90.

Shulaker, et al.; "Three-dimensional integration of nanotechnologies for computing and data storage on a single chip" Nature 22994, vol. 547; Jul. 6, 2017; 19 pgs.

Baldauf, et al.; "Stress-Dependent Performance Optimization of Reconfigurable Silicon Nanowire Transistors"; IEEE Electron Device Letters, vol. 36, No. 10; Oct. 2015; pp. 991-993.

Baumgardner, et al.; "Inherent linearity in carbon nanotube field-effect transistors"; Applied Physics Letters 91, 052107; American Institute of Physics; Jun. 22, 2006; 4 pgs.

Bozanic, et al.; "Millimeter-Wave Low Noise Amplifiers"; Springer; http://www.springer.com/series/4748; 2018; 344 pgs.

Niknejad, et al.; "mm-Wave Silicon Technology 60GHz and Beyond"; Springer; 2008; 313 pgs.

Bozanic, et al.; "Systems-Level Packaging for Millimeter-Wave Transceivers"; Springer; http://www.springer.com/series/10617; 2019; 288 pgs.

Brady, et al.; "Channel length scaling behavior in transistors based on individual versus dense arrays of carbon nanotubes"; AIP Publishing; https://doi.org/10.1063/1.4996586; Journal of Applied Physics 122; 2017; 8 pgs.

Burke; "An RF Circuit Model for Carbon Nanotubes"; IEEE Transactions on Nanotechnology, vol. 2, No. 1; Mar. 2003; pp. 55-58.

Bushmaker, et al.; "Electrical Transport and Channel Length Modulation in Semiconducting Carbon Nanotube Field Effect Transistors"; IEEE Transactions on Nanotechnology, vol. 13, No. 2; Mar. 2014; pp. 176-181.

Cao, et al.; "High-performance radio frequency transistors based on diameter-separated semiconducting carbon nanotubes"; Applied Physics Letters 108, 233105; Feb. 1, 2016; 6 pgs.

Cao, et al.; "Carbon nanotube transistors scaled to a 40-nanometer footprint"; Device Technology; Science 356; http://science.sciencemag.org; Jun. 30, 2017; 5 pgs.

Chang, et al.; "Advanced CMOS Technology Portfolio for RF IC Applications"; IEEE Transactions on Electron Devices, vol. 52, No. 7; Jul. 2005; pp. 1324-1334.

Che, et al.; "Self-Aligned T-Gate High-Purity Semiconducting Carbon Nanotube RF Transistors Operated in Quasi-Ballistic Transport and Quantum Capacitance Regime"; ACSNANO; www.acsnano.org, vol. 6, No. 8; 2012; pp. 3936-6943.

Che, et al.; "T-Gate Aligned Nanotube Radio Frequency Transistors and Circuits with Superior Performance" ACSNANO; www.acsnano.org, vol. 7, No. 5; 2013; pp. 4343-4350.

(56) References Cited

OTHER PUBLICATIONS

Chen, et al.; "Electric-Field-Dependent Charge-Carrier Velocity in Semiconducting Carbon Nanotubes"; The American Physical Society; Physical Review Letters; PRL 95, 236803; 2005; pp. 1-4.

Chortos, et al.; "Universal Selective Dispersion of Semiconducting Carbon Nanotubes from Commercial Sources Using a Supramolecular Polymer"; ACSNANO; www.acsnano.org; American Chemical Society; Feb. 15, 2017; pp. 5660-5669.

Durkop, et al.; "Extraordinary Mobility in Semiconducting Carbon Nanotubes"; Nano Letters, vol. 4, No. 1; 2004; pp. 35-39.

Egginger, et al.; "Current versus gate voltage hysteresis in organic field effect transistors"; Monatsh Chem 140; Springer; Feb. 11, 2009; pp. 735-750.

Liu, et al.; "Fabrication of CNFETS with Low-Resistance Electrical Contacts"; Transducers 2013, Barcelona, Spain Jun. 16-20, 2013; pp. 2009-2012.

Farmer, et al.; "Impact of gate resistance in graphene radio frequency transistors"; Appl. Phys. Lett. 101, 143503; 2012; 4 pgs.

Fediai, et al.; "Impact of incomplete metal coverage on the electrical properties of metal-CNT contacts: A large-scale ab initio study"; AIP Publishing; Applied Physics Letters 109, 103101; 2016; 5 pgs.

Franklin, et al.; "Length scaling of carbon nanotube transistors"; nature nanotechnology,vol. 5; www.nature.com/naturenanotechnology; Dec. 2010; 6 pgs.

Franklin, et al.; "Variability in Carbon Nanotube Transistors: Improving Device-to-Device Consistency"; ACSNANO, vol. 6, No. 2; www.acsnano.org; 2012; pp. 1109-1115.

Franklin, et al.; "Defining and Overcoming the Contact Resistance Challenge in Scaled Carbon Nanotube Transistors" ACSNANO, vol. 8, No. 7; www.acsnano.org; 2014; pp. 7333-7339.

Guo, et al.; "Assessment of High-Frequency Performance Potential of Carbon Nanotube Transistors"; IEEE Transactions on Nanotechnology, vol. 4, No. 6; Nov. 2005; pp. 715-721.

\* cited by examiner

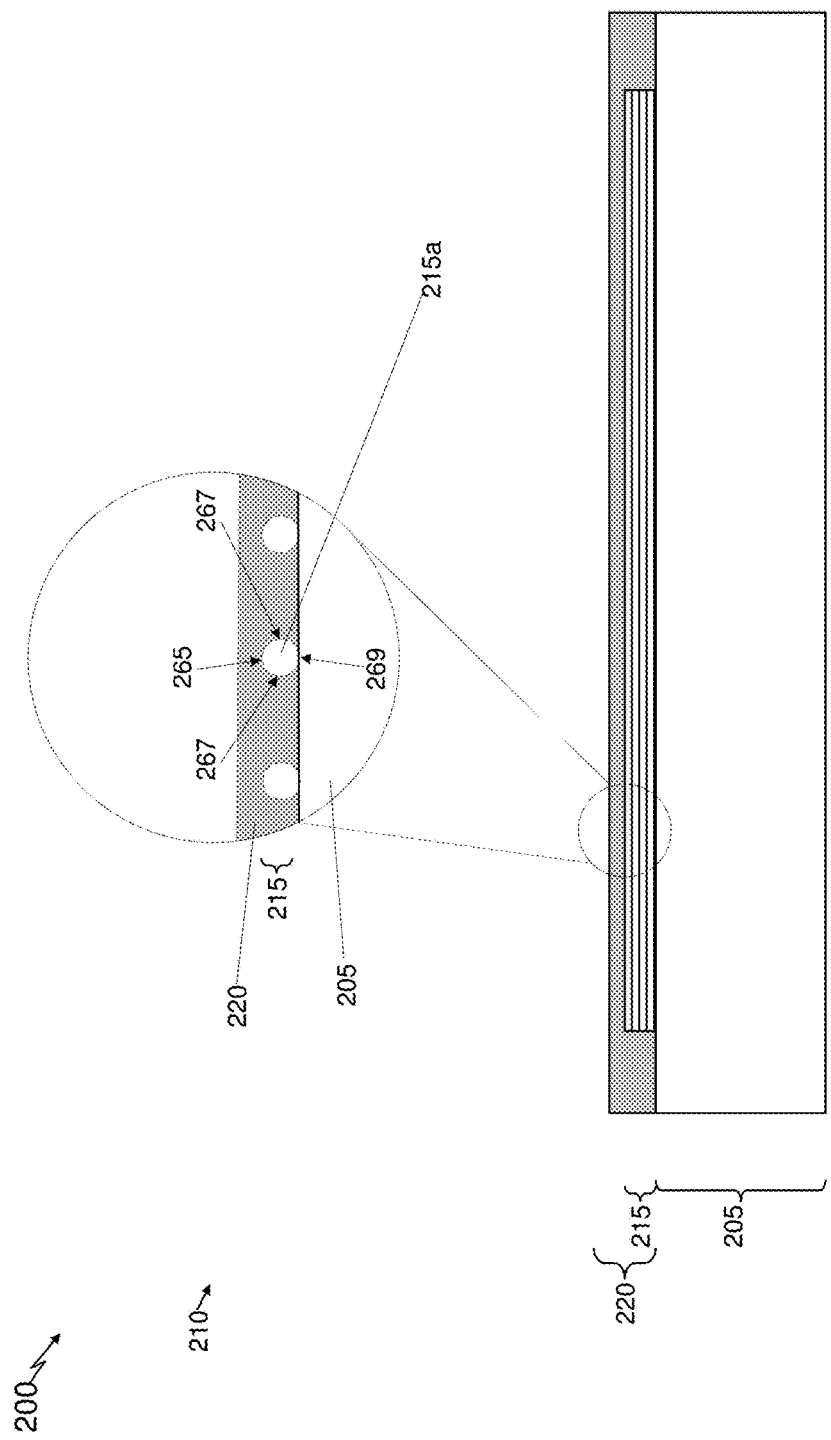

ELECTRICAL DEVICES HAVING RADIOFREQUENCY FIELD EFFECT TRANSISTORS AND THE MANUFACTURE THEREOF

CROSS-REFERENCE TO RELATED APPLICATION

This application is a divisional of U.S. patent application Ser. No. 16/431,359, entitled "ELECTRICAL DEVICES HAVING RADIOFREQUENCY FIELD EFFECT TRANSISTORS AND THE MANUFACTURE THEREOF", filed on Jun. 4, 2019. The above-listed application(s) are commonly assigned with the present application are incorporated herein by reference as if reproduced herein in their entirety.

TECHNICAL FIELD

This application is directed, in general, to electrical devices having radiofrequency field effect transistors, and more specifically, radiofrequency field effect transistors with carbon nanotube channels and methods of manufacturing such devices.

BACKGROUND

High speed high performance radiofrequency field effect transistors with carbon nanotube (CNT) channels are thought to have a number promising uses in a variety of electrical devices, such as wireless communication devices. In order to be able fully exploit the use of such transistors, however, it is desirable for a manufacturing process flow to be scalable for mass production. Typically, such up-scaled process flows include steps involving the use of aqueous solutions for cleaning and etching or other steps involving resist spinning, development, and stripping.

SUMMARY

One aspect provides a method of manufacturing an electrical device. The method includes providing a substrate having a surface and forming a radiofrequency field effect transistor on the substrate surface. Forming the radiofrequency field effect transistor includes forming a CNT layer on the substrate surface, the CNT layer including electrically conductive aligned carbon nanotubes and depositing a pin-down layer on the CNT layer. Forming the radiofrequency field effect transistor also includes patterning the pin-down layer to form separate pin-down anchor layers. A first portion of the CNT layer, located in-between the pin-down anchor layers, is not covered by the pin-down anchor layers and second portions of the CNT layer are covered by the pin-down anchor layers. For cross-sections in a direction perpendicular to a common alignment direction of the electrically conductive aligned carbon nanotubes in the first portion of the CNT layer: the electrically conductive aligned carbon nanotubes have an average linear density in a range from 20 to 120 nanotubes per micron along the cross-sections, and, at least 40 percent of the electrically conductive aligned carbon nanotubes are discrete from any carbon nanotubes of the CNT layer.

Another aspect is an electrical device, the electrical device including a substrate having a surface and a radiofrequency field effect transistor on the substrate surface. The radiofrequency field effect transistor includes a CNT layer on the substrate surface and pin-down anchor layers on the CNT layer. The CNT layer includes electrically conductive aligned carbon nanotubes. A first portion of the CNT layer, located in-between the pin-down anchor layers, is not covered by the pin-down anchor layers and is a channel region of the radiofrequency field effect transistor. Second portions of the CNT layer are covered by the pin-down anchor layers. For cross-sections in a direction perpendicular to a common alignment direction of the electrically conductive aligned carbon nanotubes in the first portion of the CNT layer: the electrically conductive aligned carbon nanotubes have an average linear density in a range from 20 to 120 nanotubes per micron along the cross-section, and, at least 40 percent of the electrically conductive aligned carbon nanotubes are discrete from any carbon nanotubes of the CNT layer.

BRIEF DESCRIPTION

Figure 5:
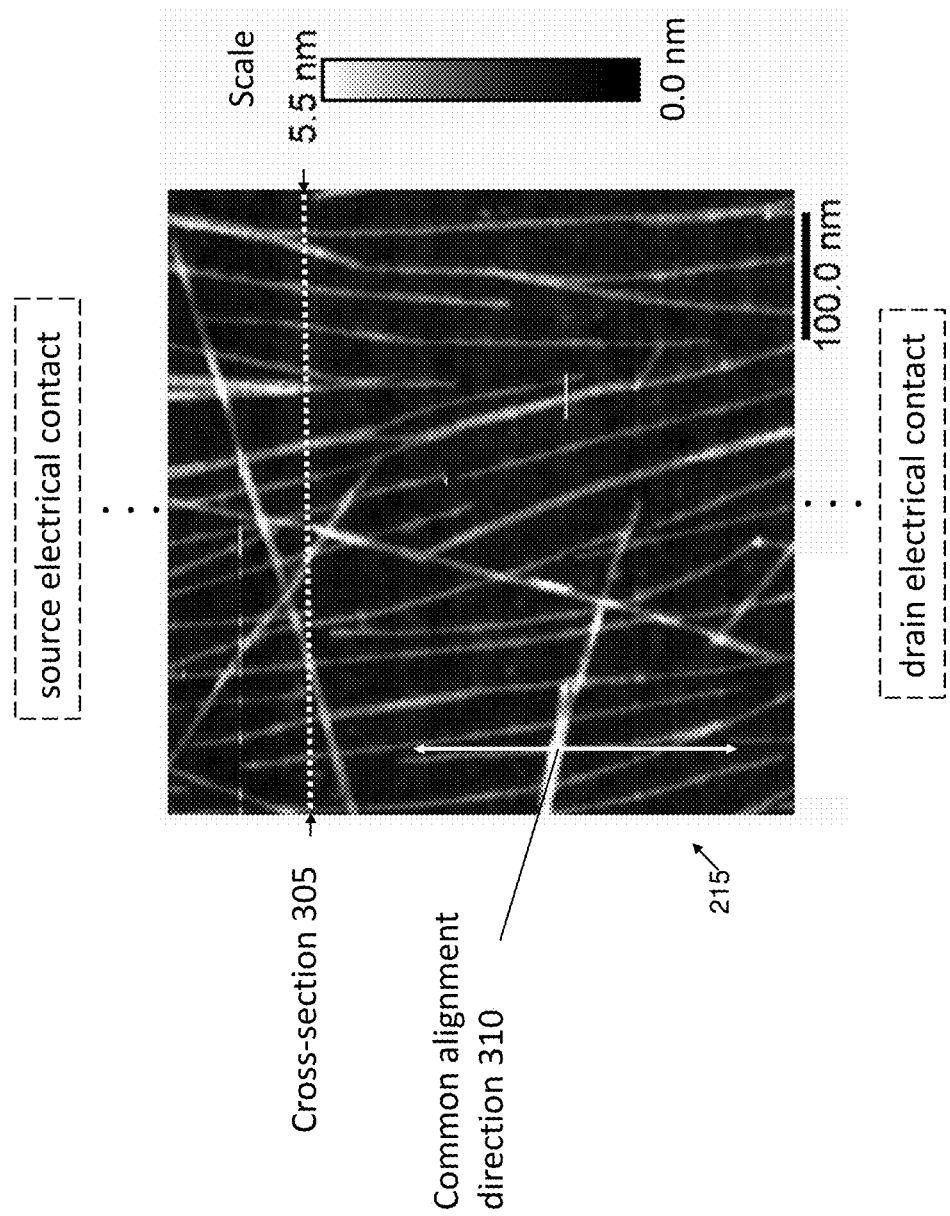
Figure 6:
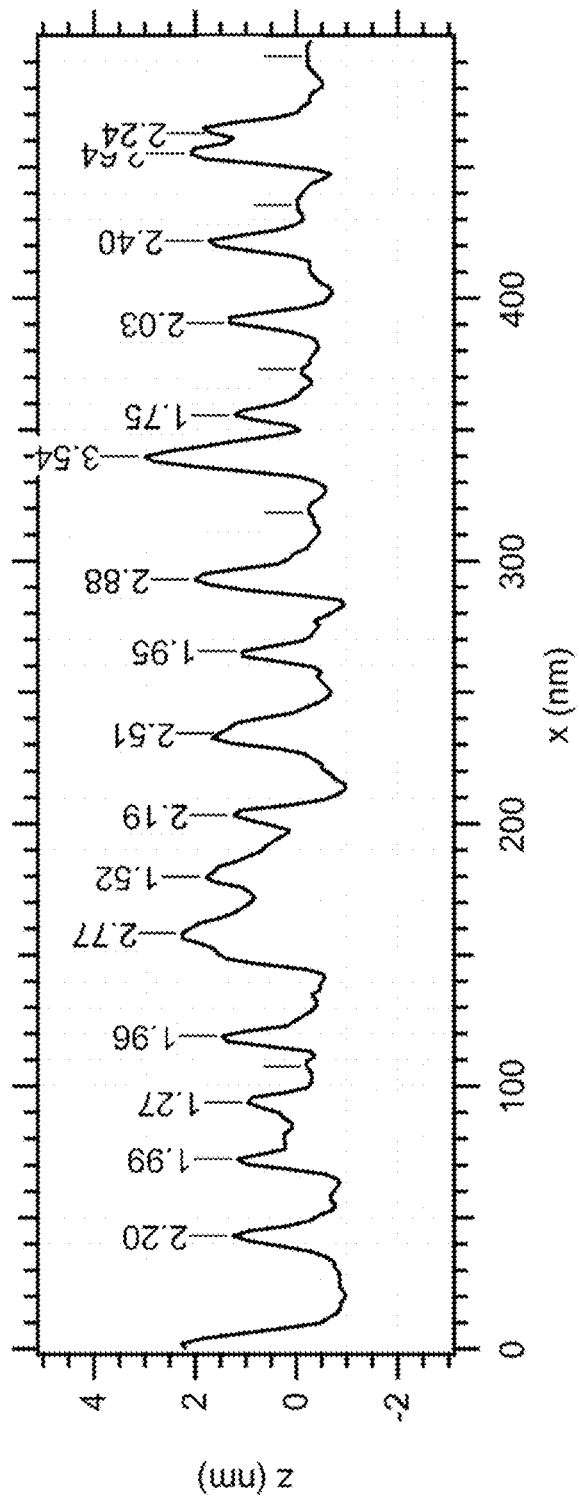
Figure 7:
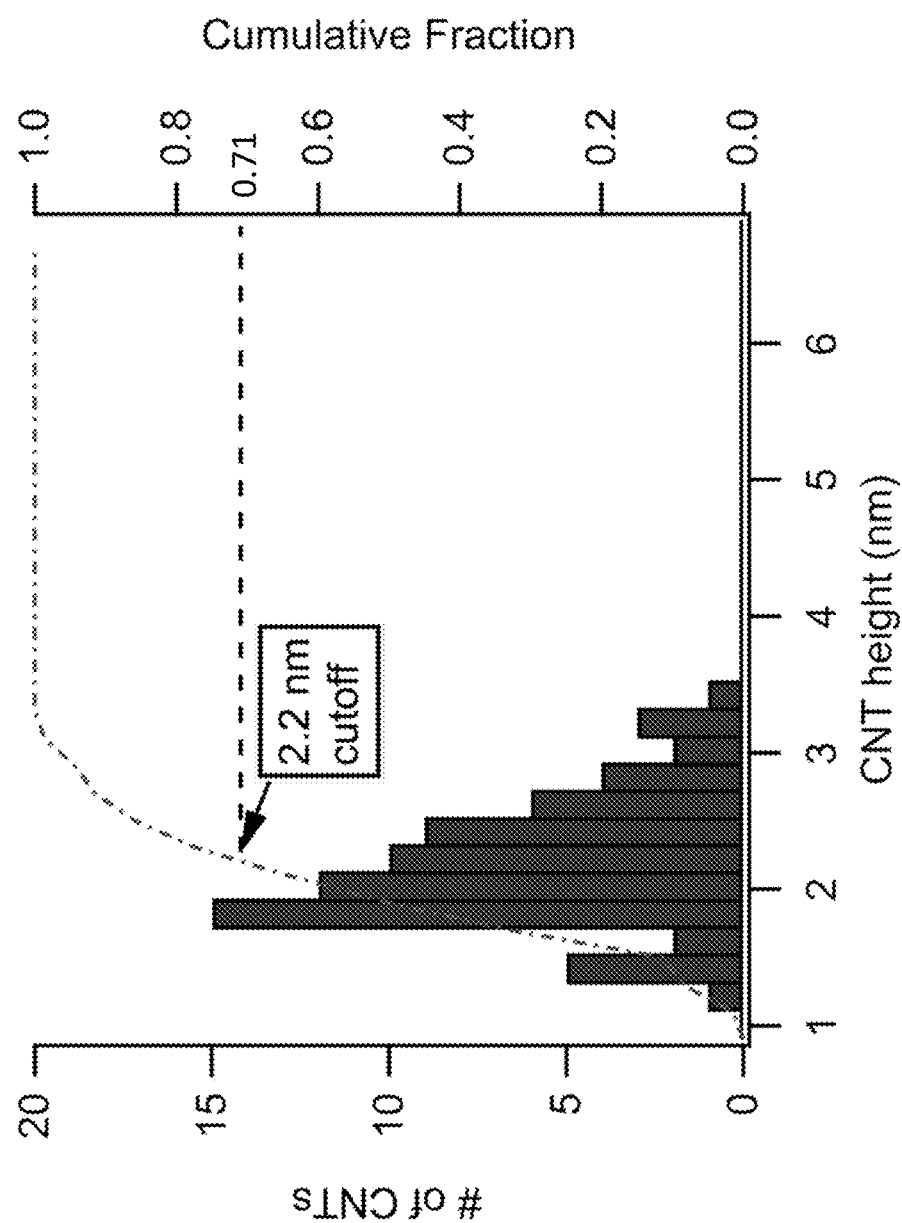
Figure 8:
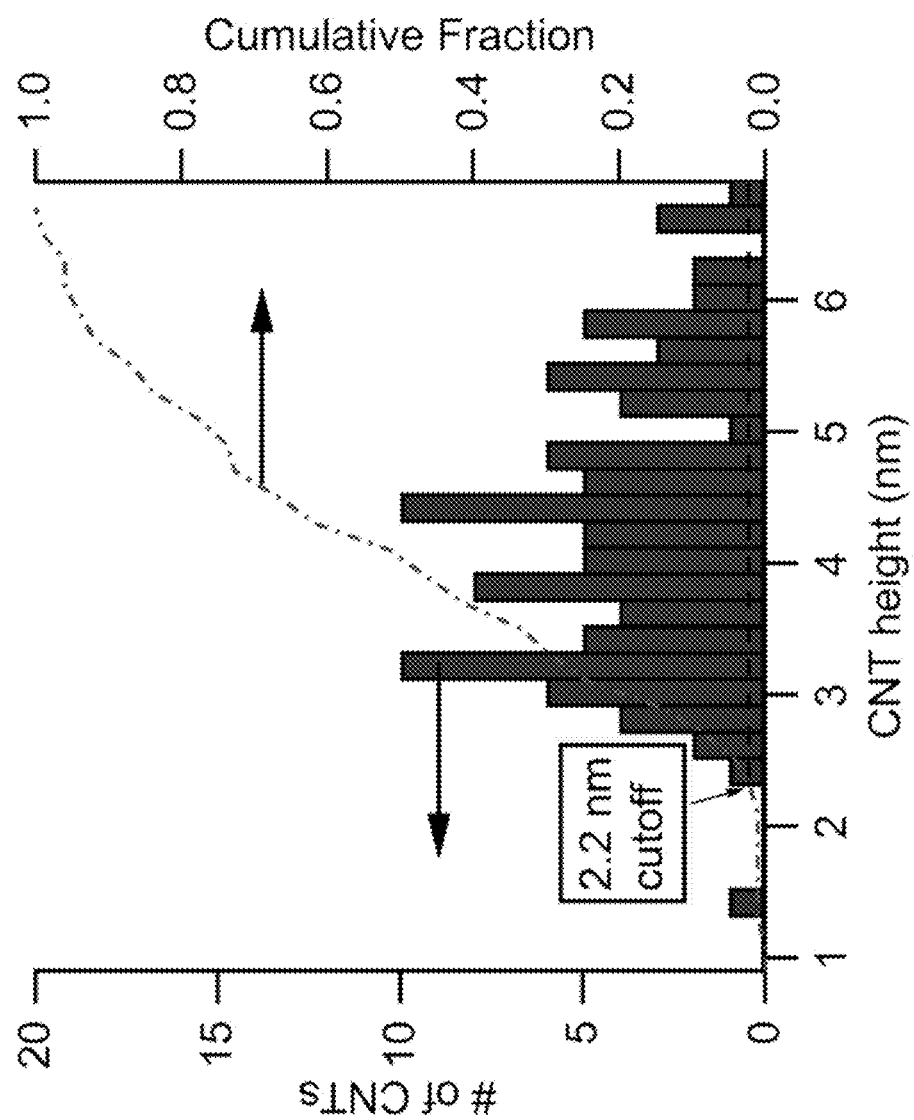

Reference is now made to the following descriptions taken in conjunction with the accompanying drawings, in which:

FIG. 1 presents a flow diagram of an example method of manufacturing an electrical device in accordance with the disclosure;

FIGS. 2A to 2H present cross-sectional views of an example electrical device at different stages of manufacture, such as different stages in the example method disclosed in the context of FIG. 1;

FIGS. 3A to 3H present plan views of the example electrical device at selected stages of manufacture, such as different steps in the example method disclosed in the context of FIG. 1 and corresponding to FIGS. 2A to 2H, respectively;

FIGS. 4A to 4F present cross-sectional views of another example electrical device at different stages of manufacture, such as different stages in the example method disclosed in the context of FIG. 1;

FIG. 5 presents an example atomic force microscopic image of a carbon nanotube deposed on a substrate of a radio frequency field effect transistor in according with the method disclosed in the context of FIG. 1;

FIG. 6 presents an example tapping mode linescan profile of carbon nanotube heights as measured for one cross-section of the example atomic force microscopic image shown in FIG. 5;

FIG. 7 presents a histogram of carbon nanotube heights as measured from a plurality tapping mode linescan profiles analogous to that illustrated in FIG. 6 where the radio frequency field effect transistor includes pin-down anchor layers; and FIG. 8 presents a histogram of carbon nanotube heights as measured from a plural tapping mode linescan profiles analogous to that illustrated in FIG. 6, where the radio frequency field effect transistor does not include pin-down anchor layers.

DETAILED DESCRIPTION

Embodiments of the present disclosure benefit from our discovery that as the linear density of carbon nanotubes on a surface increase and the spacing between adjacent carbon nanotubes correspondingly decrease, there is an increased tendency for the carbon nanotubes to adhere to each other and form bundles of two or more carbon nanotubes or for two or more carbon nanotubes to become crossed with each other. We further discovered that the electrical properties of radiofrequency field effect transistors with channels having substantial amounts of such bundled or crossed carbon nanotubes are deteriorated.

While not limiting the scope of the disclosure by theoretical considerations, we believe that the bundling or crossing of carbon nanotubes can undesirably increase field screening effects which detrimentally affect the ability of an electrical field (e.g., from an applied gate voltage) to modulate the output current from a transistor channel having such a CNT layer and detrimentally increase the contact resistance between the transistor channel of nanotubes and the metal contact electrodes.

While not limiting the scope of the disclosure by theoretical considerations, we believe that on a nanoscale, the carbon nanotubes experience substantially two opposing van der Waals forces. The first force is from the adjacent carbon nanotubes pulling towards each other, and the second force is from the substrate surface attracting the carbon nanotubes. Under some conditions, the substrate's attractive force dominates while under other conditions the attractive forces between adjacent carbon nanotubes carbon dominates. Bundling tends to occur when the latter attractive forces are dominant. We believe that carbon nanotubes deposited in a common alignment direction can be bundled for at least a portion of their lengths, and further bundling can proceed when the attractive forces between adjacent carbon nanotubes dominate. Accordingly, the propensity for bundling has been found to increase with an increasing linear density of the carbon nanotubes, e.g., likely because adjacent carbon nanotubes will contact each other or at least be closer together and thus experience a stronger attractive force to each other and thereby bundle together.

Bundling can occur whenever mechanical forces on the nanotubes overcome their attraction to the substrate. When this happens in solution, the nanotubes may be lifted from the substrate and two or more carbon nanotubes can "zip together" from existing contact points. For example, we discovered that the tendency for the bundling or the crossing of carbon nanotubes with each other may be enhanced when the transistor's fabrication include steps where the carbon nanotubes are exposed to an aqueous solution. While not limiting the scope of the disclosure by theoretical considerations, we believe this likely is due to the high surface tension of water pulling on deposited carbon nanotubes while surface water is evaporating. Similar forces may come into play when spinning on photoresist, in which shear forces from the advancing fluid front will cause bundling. We believe that bundling may also occur during etching or stripping processes in either aqueous or non-aqueous solutions, in which large portions/chunks of the material being etched or stripped adhere to the nanotubes and can cause the nanotubes to be lifted from the surface during the etching or stripping process.

Further, as part of the present disclosure, we have developed procedures to mitigate bundle formation even in the presence of aqueous solutions. In particular, we disclose our use of materials (referred to herein as, pin-down anchor layers) to cover and thereby pin-down the end portions of the carbon nanotubes on a substrate surface to mitigate bundling.

We have discovered that such pin-down anchor layers help keep substantial lengths of uncovered central portions of the carbon nanotubes discrete from each other. Again, while not limiting the scope of the disclosure by theoretical considerations, we believe that the pin-down anchor layers limit the ability of the carbon nanotubes to move over the surface of the substrate during subsequent processing steps, even processing steps using aqueous solutions. The ability to form a carbon nanotube layer with a high density of electrically conductive aligned carbon nanotubes, and with a large proportion being discrete carbon nanotubes, allows the manufacture of radiofrequency field effect transistors having channel regions with superior electrical properties. Consequently, devices having such radiofrequency field effect transistors can be manufactured using processing steps including aqueous solutions, commensurate with a scaled-up fabrication process flow.

One aspect of the disclosure is a method of manufacturing an electrical device. FIG. 1 presents a flow diagram of an example method 100 of manufacturing an electrical device in accordance with the disclosure. FIGS. 2A to 2H present cross-sectional views of an example electrical device 200 at different stages of manufacture, such as the different steps in the example method 100 disclosed in the context of FIG. 1. FIG. 3A to 3H present plan views of the example electrical device 200 at selected stages of manufacture, such as different steps in the example method disclosed in the context of FIG. 1 and corresponding to FIGS. 2A to 2F, respectively. For some of the plan views, some portions of layers are not fully depicted and/or are depicted semi-transparently so that certain underlying features can be more clearly presented.

With continuing reference to FIGS. 1 to 3H throughout, embodiments of the method 100 can include providing a substrate having a surface (e.g., FIG. 1, step 105; FIGS. 2A and 3A, substrate 205, substrate surface 207). Embodiments of the method 100 can include forming a radiofrequency field effect transistor on the substrate (e.g., FIG. 1, step 110; FIGS. 2A-2F and 3A-3F, transistor 210). Forming the transistor can include forming a CNT layer on the substrate surface (e.g., FIG. 1, step 115; FIGS. 2B and 3B, CNT layer 215). The CNT layer includes electrically conductive aligned carbon nanotubes. Forming the transistor 210 can also include depositing a pin-down layer on the CNT layer (e.g., FIG. 1, step 120; FIGS. 2C and 3C, pin-down layer 220). The pin-down layer covers the CNT layer. Forming the transistor can further include patterning the pin-down layer to form separate pin-down anchor layers (e.g., FIG. 1, step 125, FIGS. 2D and 3D pin-down anchor layers 225a, 225b). A first portion of the CNT layer is located in-between the pin-down anchor layers (e.g., FIG. 2D, first portion 230) is not covered by the pin-down anchor layers. Second portions of the CNT layer (e.g., FIG. 2D, second portions 235a, 235b) are covered by the pin-down anchor layers.

For cross-sections in the first portion of the CNT layer (e.g., FIG. 3B cumulatively for a plurality of cross-sections, such as cross-sections 305a-305a, 305b-305b, 350c-305c), in a direction perpendicular to a common alignment direction (e.g., FIG. 3B perpendicular to common alignment direction 310) of the electrically conductive aligned carbon nanotubes, the electrically conductive aligned carbon nanotubes can have an average linear density in a range from 20 to 120 nanotubes per micron along the cross-sections. Additionally, at least 40 percent of the electrically conductive aligned carbon nanotubes are discrete from any carbon nanotubes of the CNT layer.

Figure 2A:
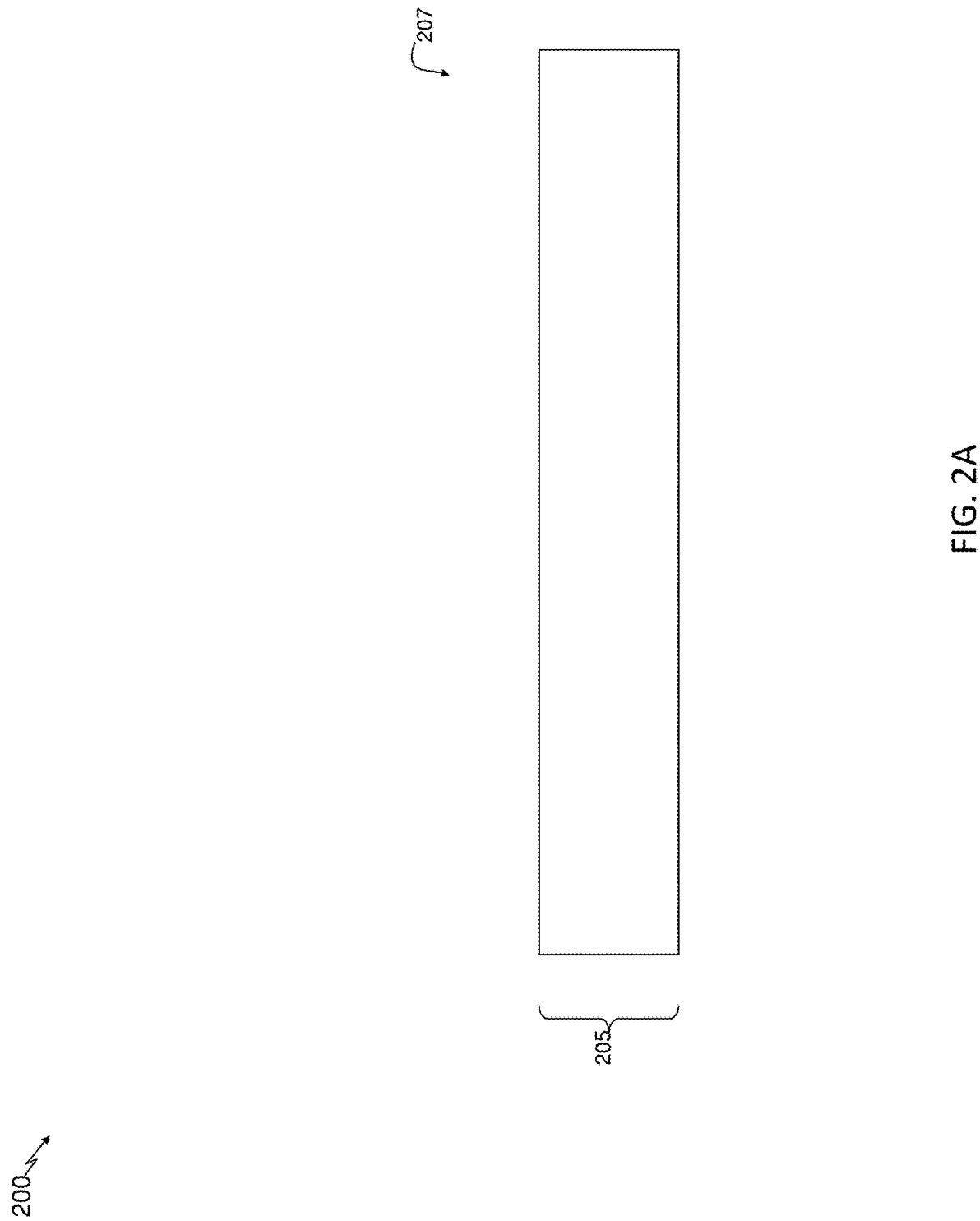
Figure 2B:
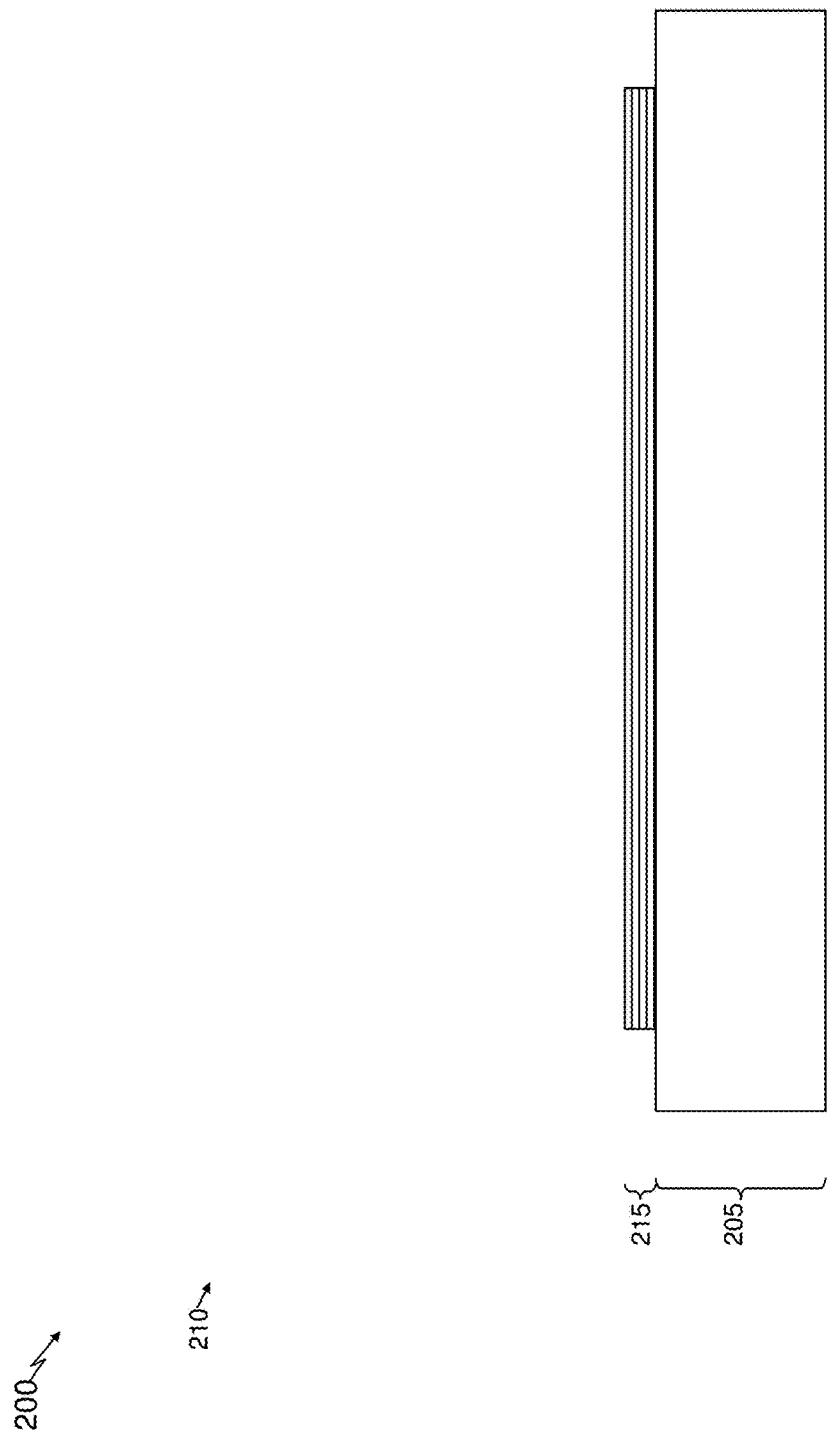
Figure 2D:
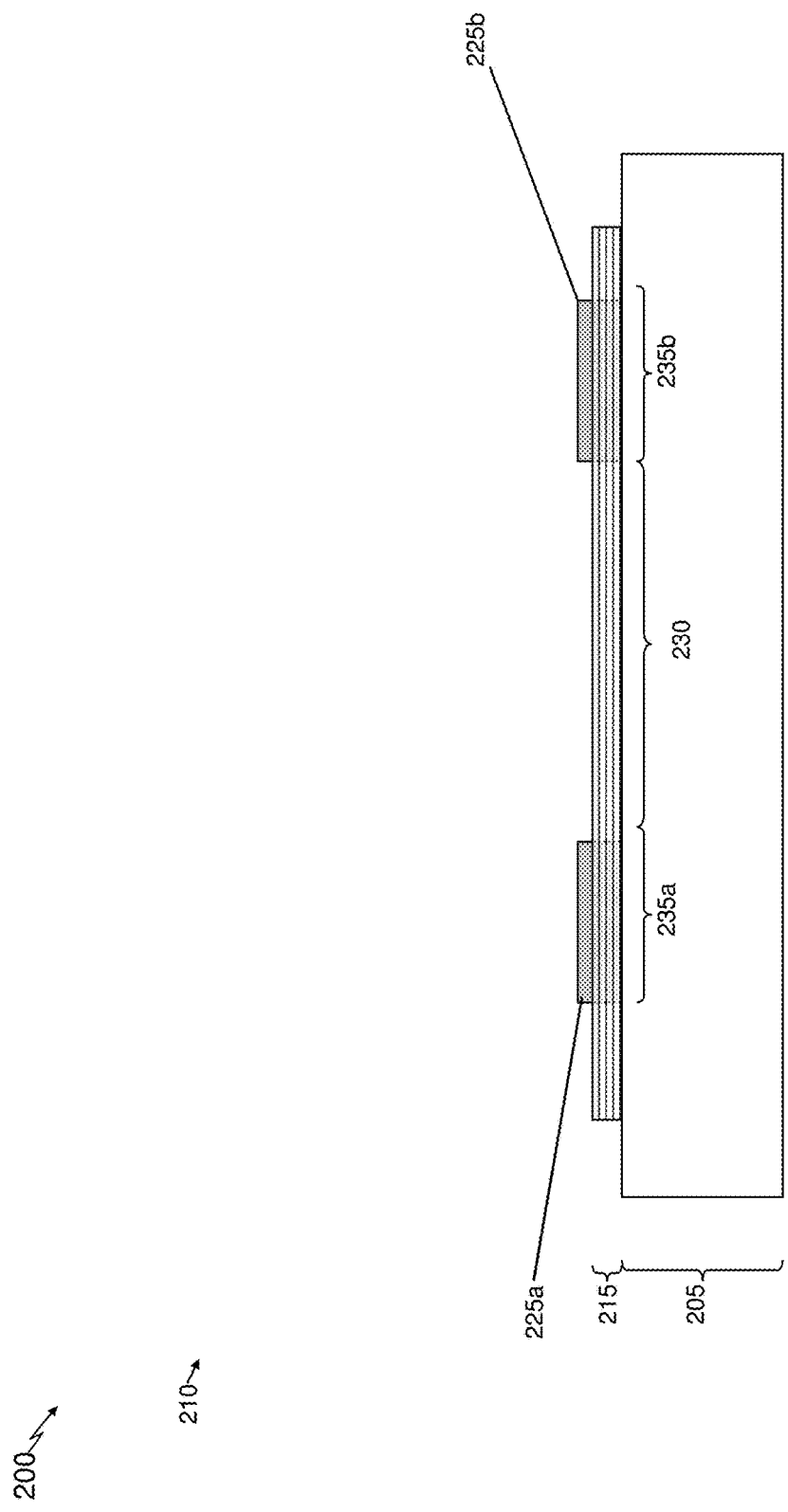
Figure 2E:
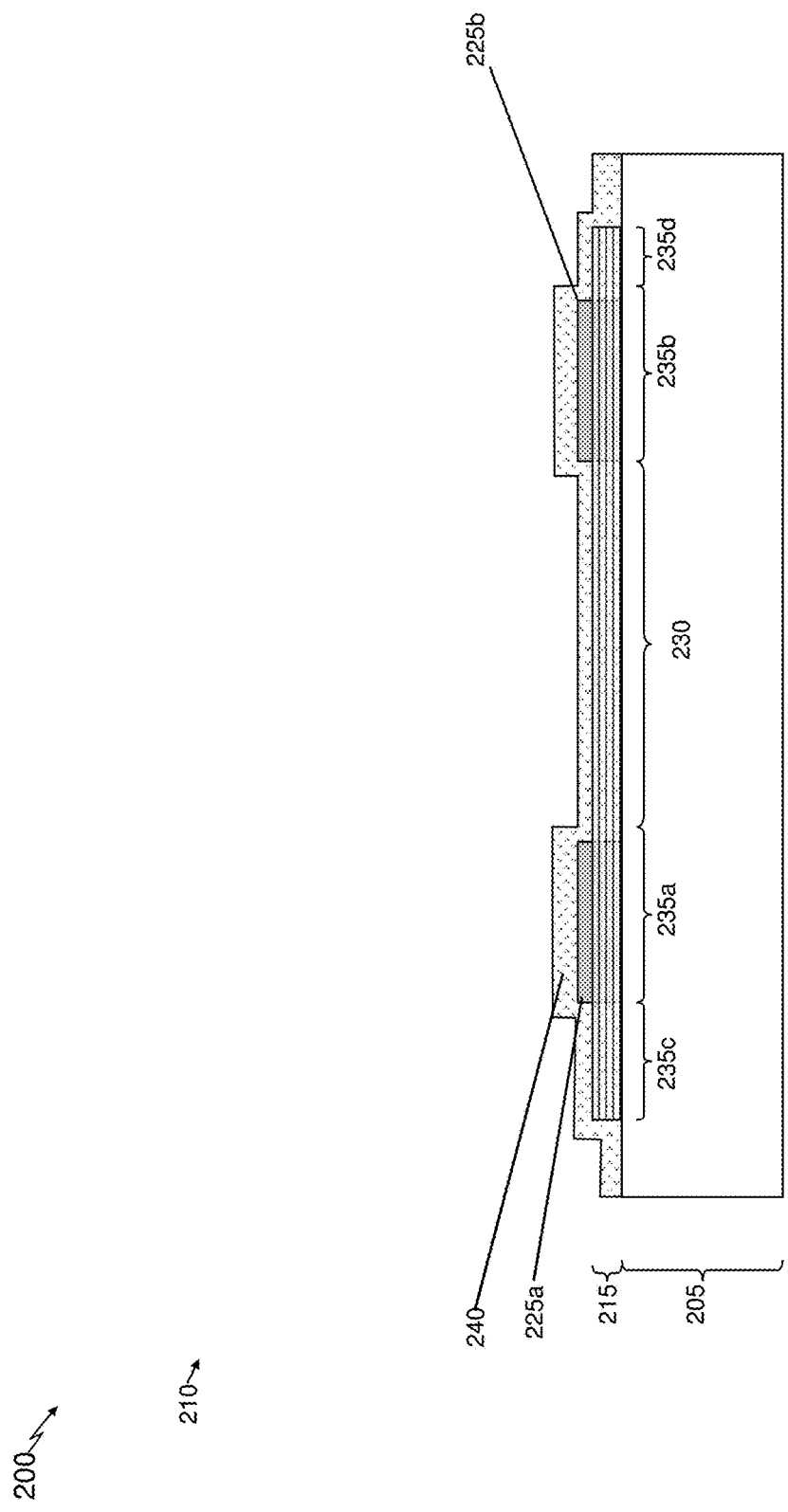
Figure 2F:
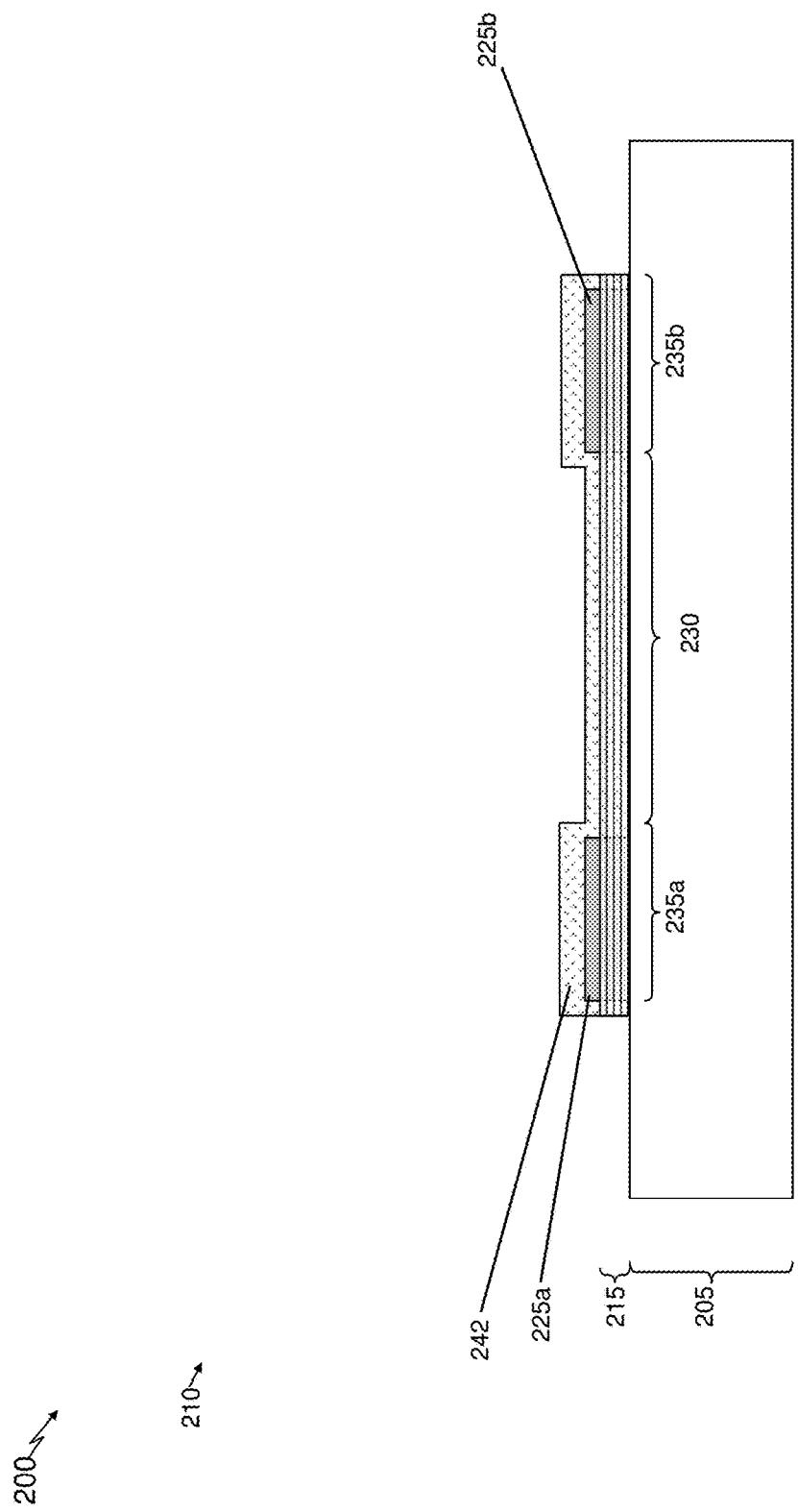
Figure 3A:
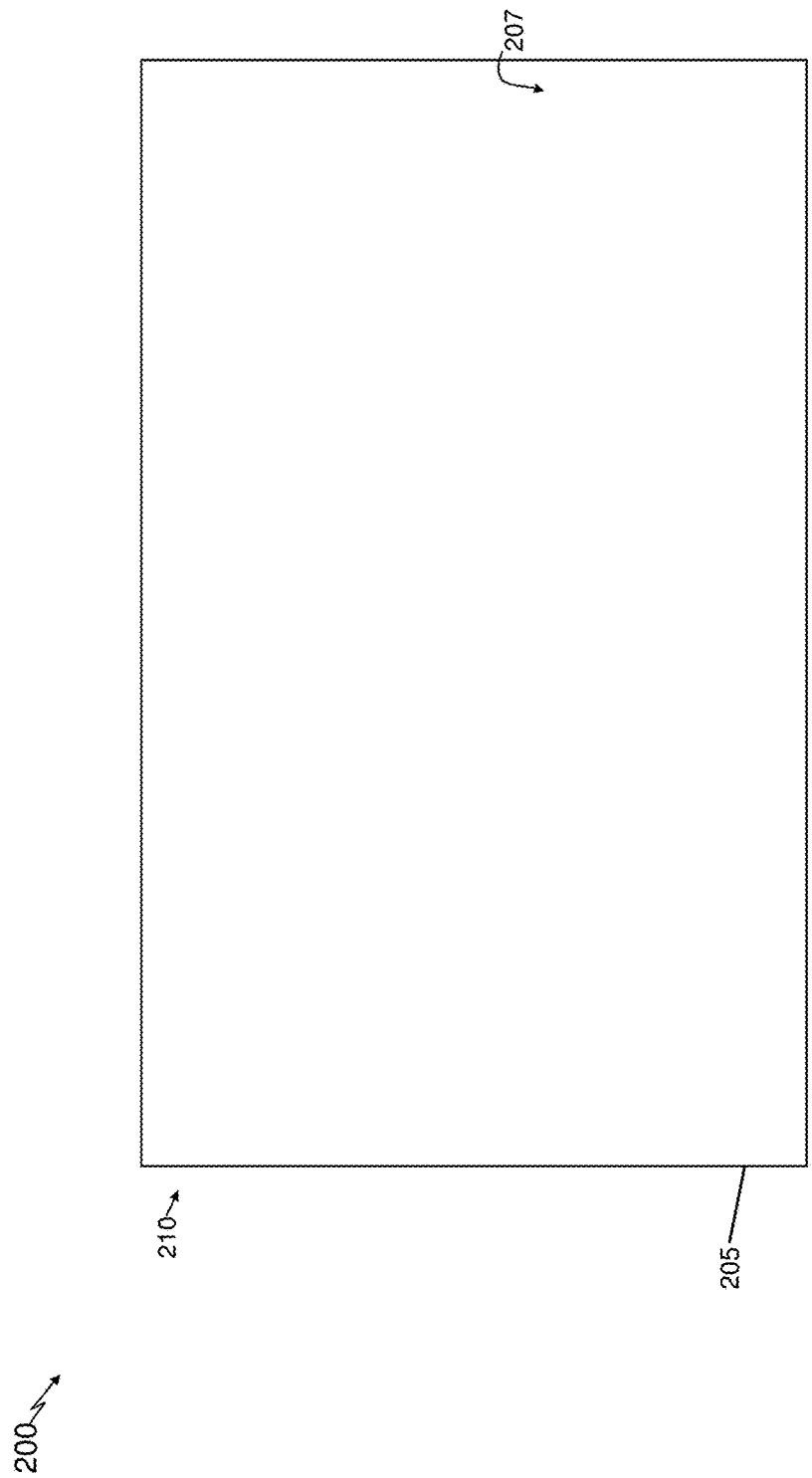
Figure 3B:
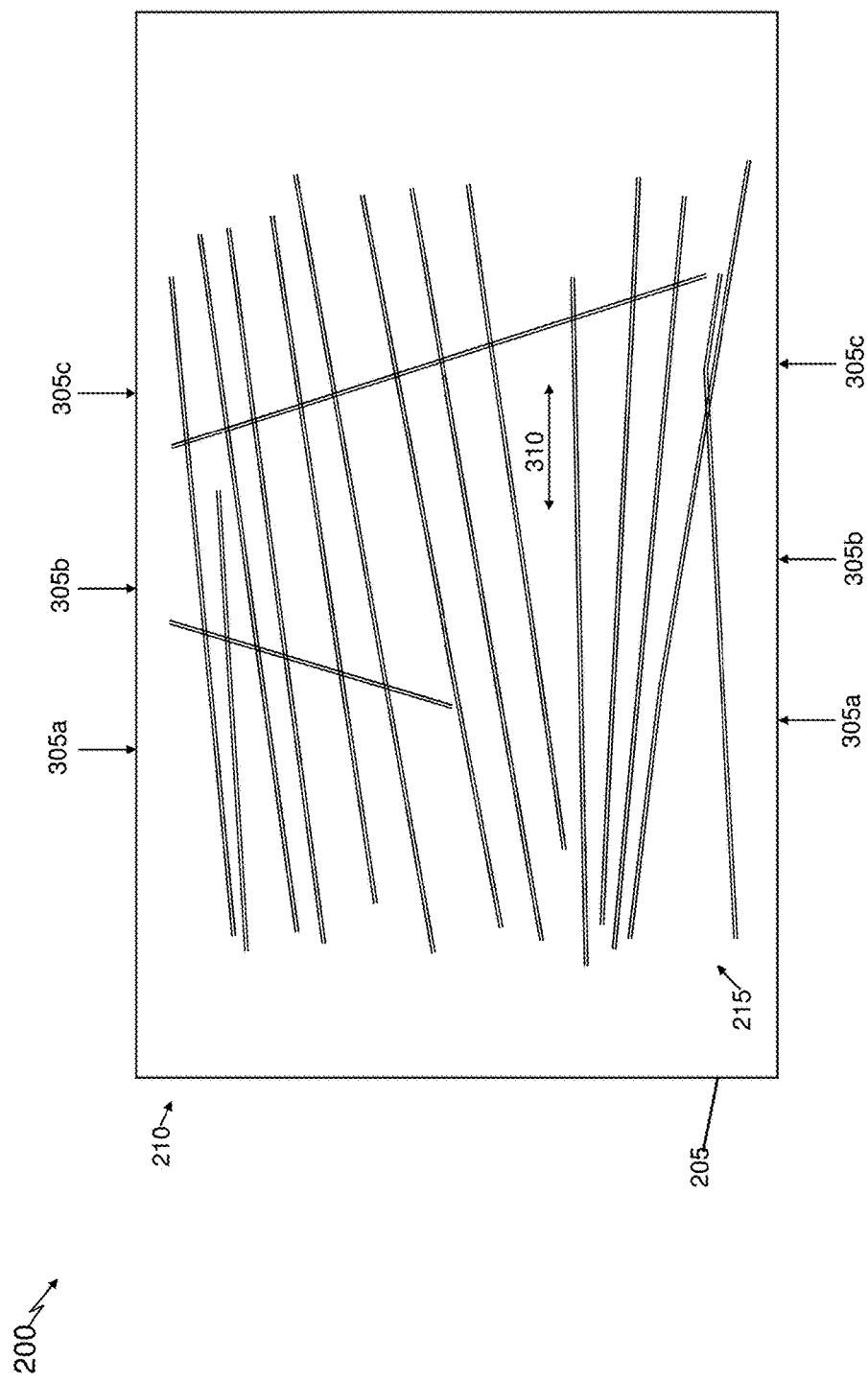
Figure 3C:
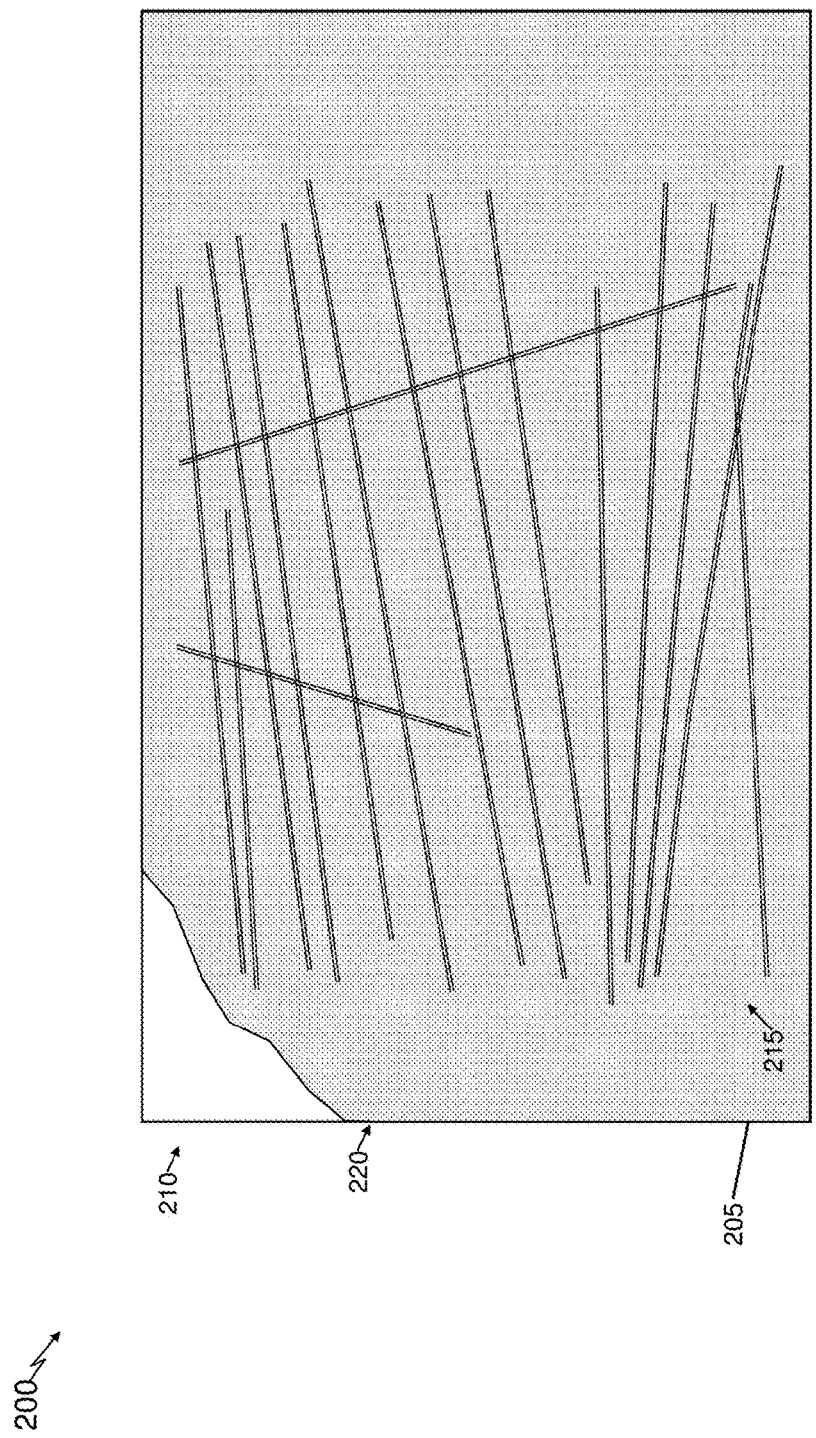
Figure 3D:
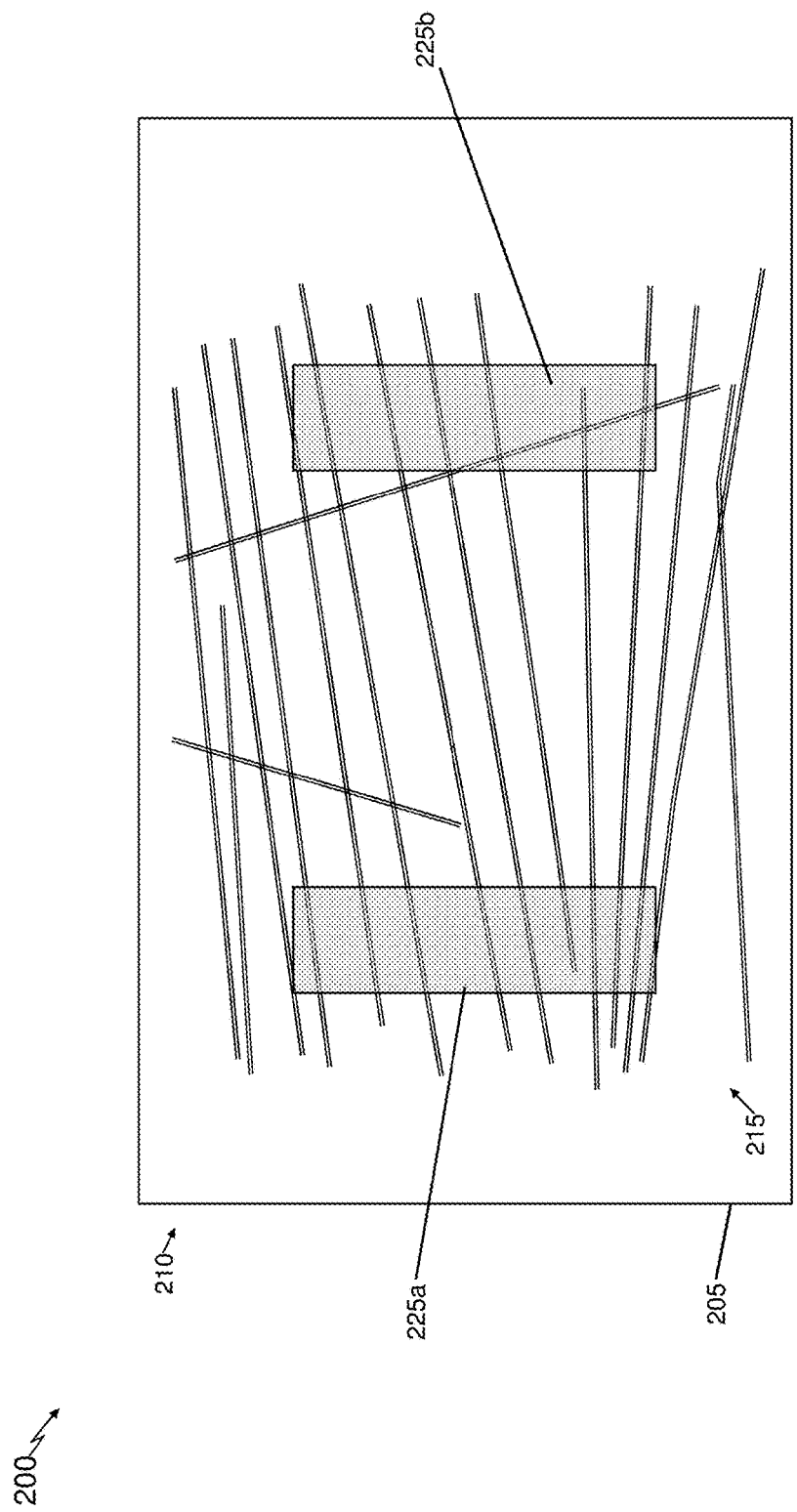
Figure 3E:
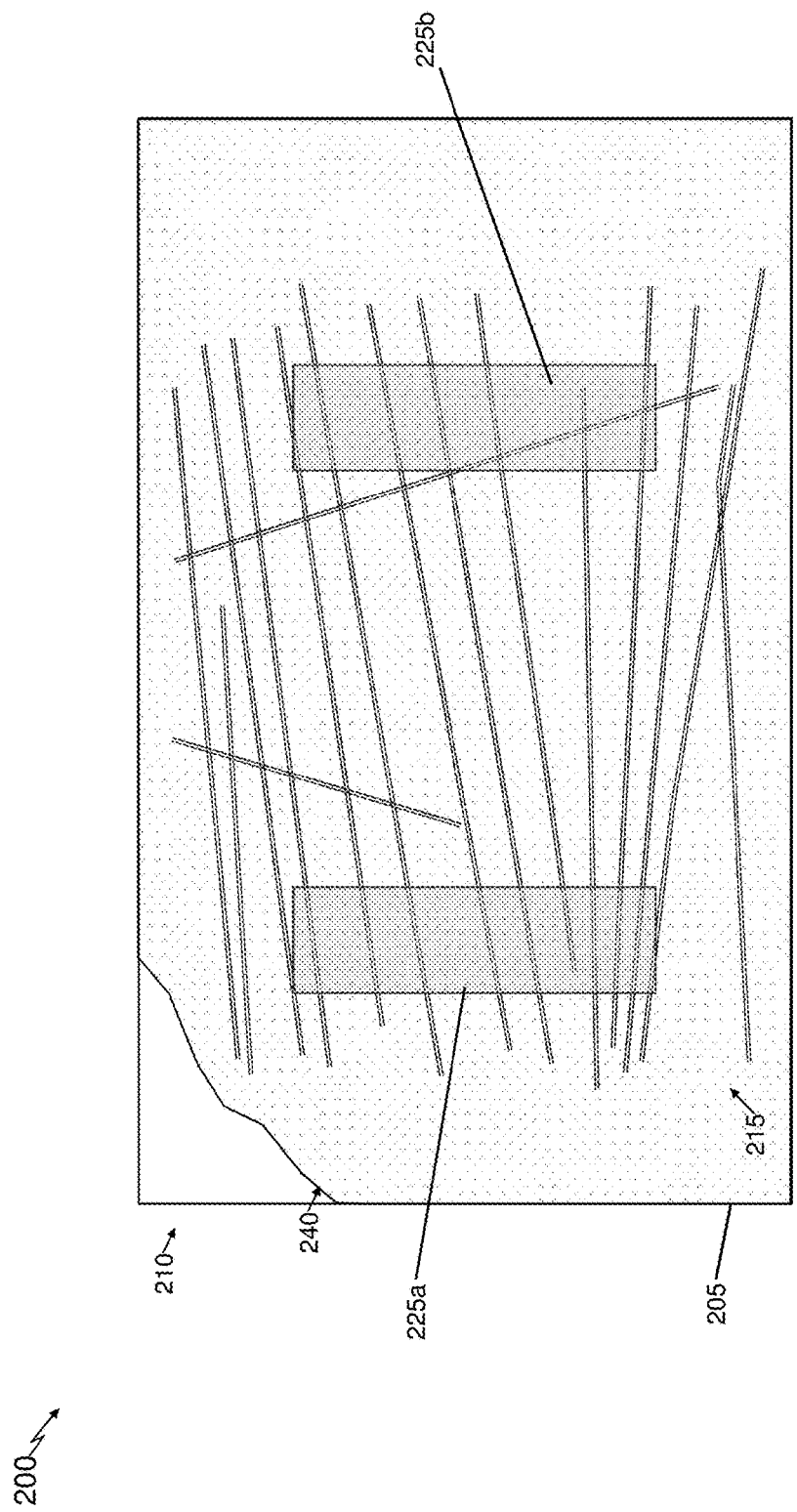

Some embodiments of the method 100 can further include, after the depositing and the patterning of the pin-down layer (e.g., FIG. 1, steps 120 and 125), depositing a protective layer on the pin-down anchor layers and the CNT layer (e.g., FIG. 1, step 130, FIGS. 2E, 3E protective layer 240). The protective layer directly covers the pin-down anchor layers and the first portion of the CNT layer. Such embodiments of the method 100 can further include then patterning to remove a third different portion the CNT layer (e.g., FIG. 1, step 135, FIGS. 2E and 3E different CNT layer portions 235c and/or 235d) that is not covered by the pin-down anchor layers and does not correspond to the first or second portions of the CNT layer. After the patterning to remove the third different portions, a remaining portion of the protective layer directly covers the pin-down anchor layers and the first portion of the CNT layer (e.g., FIGS. 2F, 3F, remaining protective layer portion 242).

The protective layer can help avoid residual resist scum forming on the CNT layer, which in turn, itself can be detrimental to the device's electrical properties by increasing resistance and creating charge traps. Additionally, the steps to remove the protective layer, e.g., involving the use of aqueous solutions, can cause bundling in the absence of the pin-down anchor layers.

In some embodiments, such as when the pin-down layer, and subsequent pin-down anchor layers, are composed of an electrically conductive material, one of the pin-down anchor layers can be, or serve as part of, a source electrode contact (e.g., pin down anchor layer 225a) and another one of the pin-down anchor layers can be, or serve as part of, a drain electrode contact (e.g., pin down anchor layer 225b) of the radiofrequency field effect transistor. The source electrode contact (e.g., the pin down anchor layer 225a as the source electrode contact) contacts one end region of the electrically conductive aligned carbon nanotubes corresponding to one of the second portions of the CNT layer (e.g., FIG. 2F, second portion 235a). The drain electrode contact (e.g., the pin down anchor layer 225b as the drain electrode contact) contacts an opposite end portion of a same one of the electrically conductive aligned carbon nanotubes corresponding to a remaining one of the second portions of the CNT layer (e.g., FIG. 2F, second portion 235b).

Figure 2G:
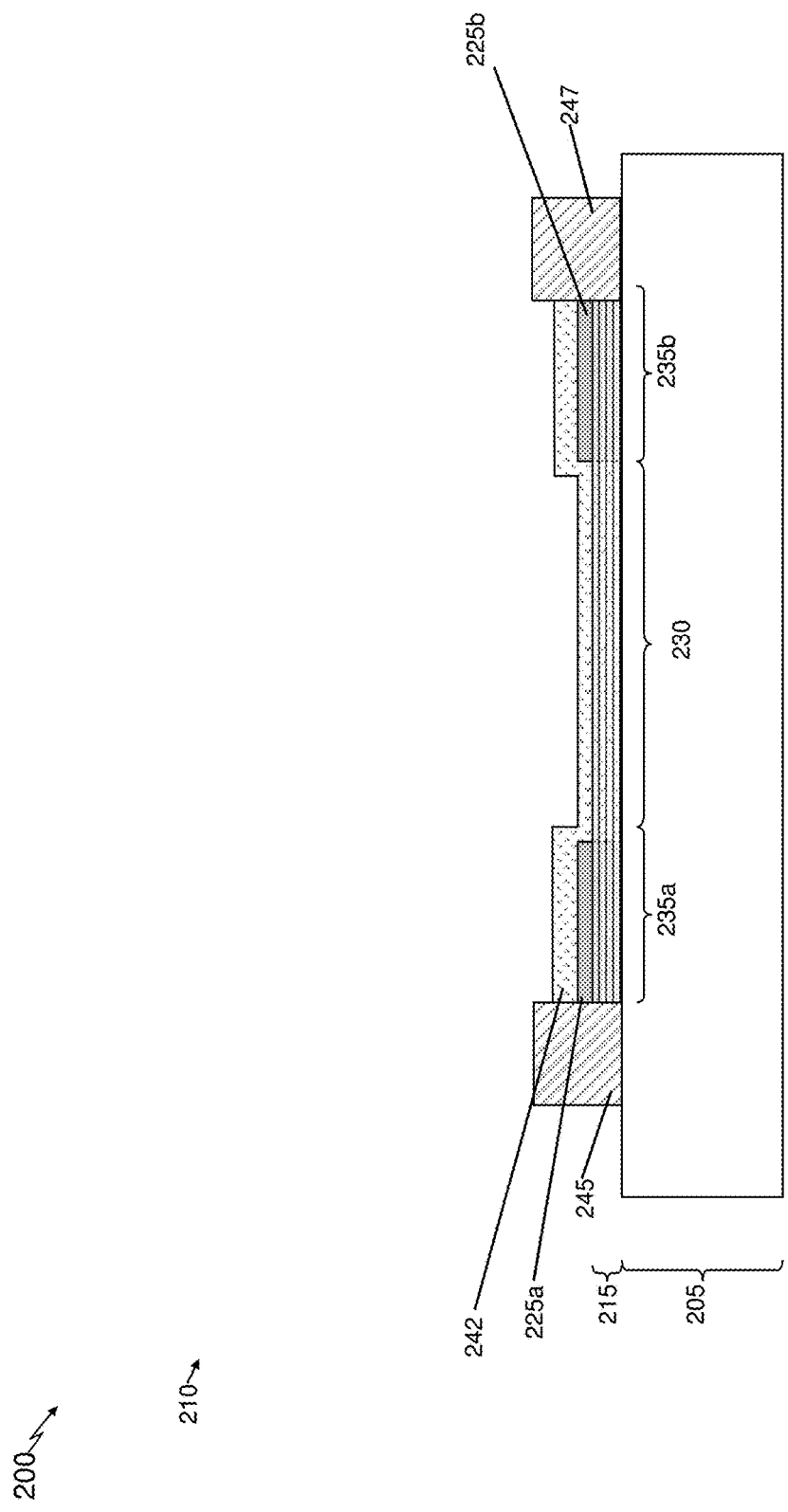

For some such embodiments, the method 100 can further include then forming source and drain electrode wires on the substrate surface (e.g., FIG. 1, step 140; FIG. 2G, source and drain electrode wires 245, 247). The source electrode wire contacts the source electrode contact and the drain electrode wire contacts the drain electrode contact. As illustrated, part of the process for forming the source and drain electrode wires can include removing portions of the protective layer overlying the CNT layer 215 and pin-down anchors layers 225a, 225b so that the source and drain electrode wires 245, 247 can make direct electrical contact with these structures.

Figure 2H:
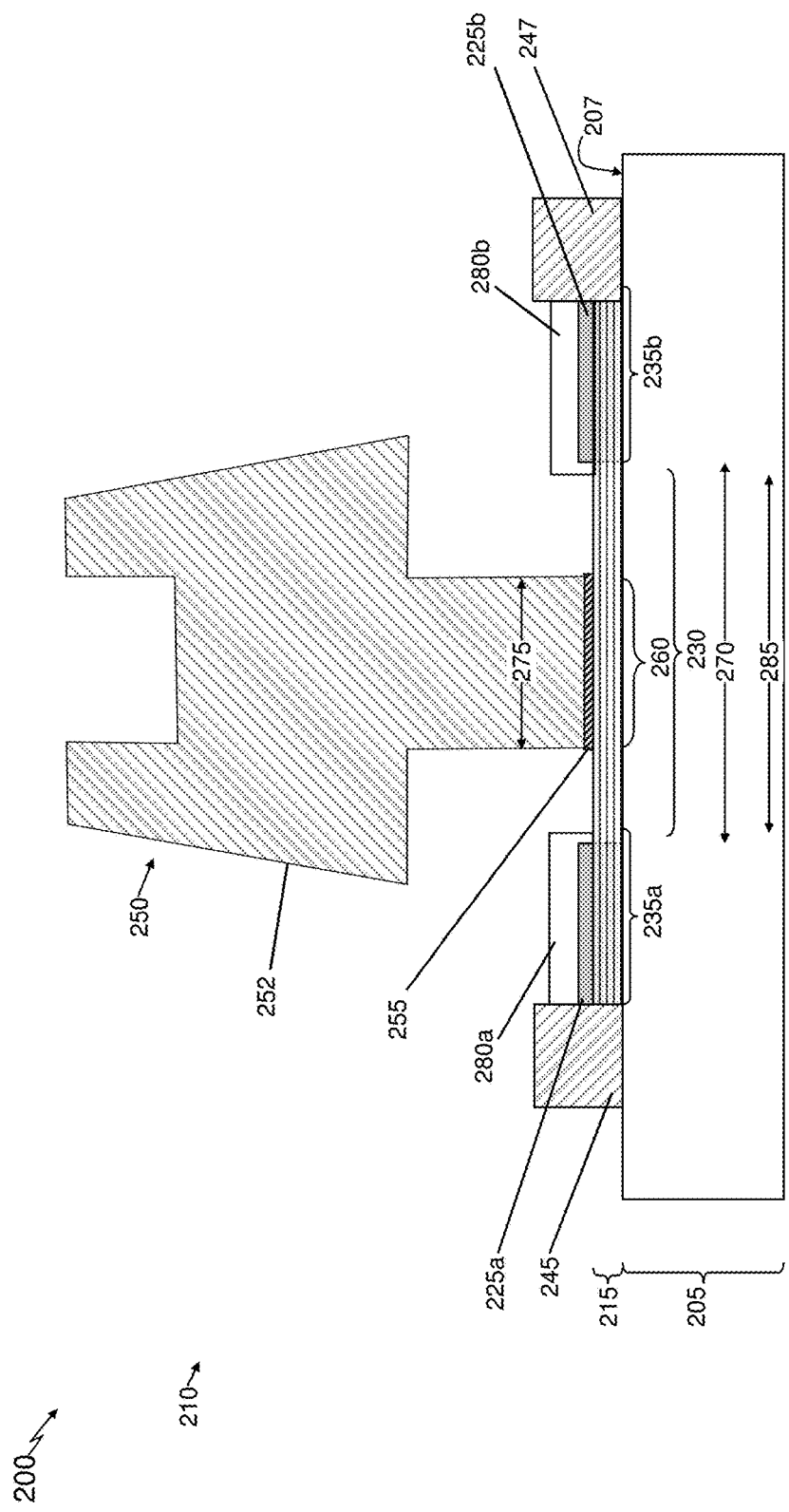

For some such embodiments, the method 100 can further include then forming a gate electrode structure on a central part of the first portion of the CNT layer (e.g., FIG. 1, step 145; FIG. 2H, gate electrode structure 250, including gate electrode 252 and gate insulator 255 on central part 260). As illustrated, in some embodiments, the gate electrode structure 250 can include a metal T-gate electrode 252.

As noted above, the deposited pin-down layer 220 covers the CNT layer 215 (FIG. 1 step 120, FIG. 2C). The term covered, as used herein, means that the pin-down layer 220 surrounds top and side surface of the individual ones of carbon nanotubes of the CNT layer (e.g., FIG. 2C detailed inset view, top 265 and sides 267 of carbon nanotube 215a) that is, the pin-down layer can completely conformally or partially conformally cover the surfaces of the carbon nanotubes (e.g., with small open space gaps between the carbon nanotubes of the CNTs layer and the pin-down layer) except for the surface facing the substrate surface (e.g., bottom surface 269 of carbon nanotube 215a).

Figure 3F:
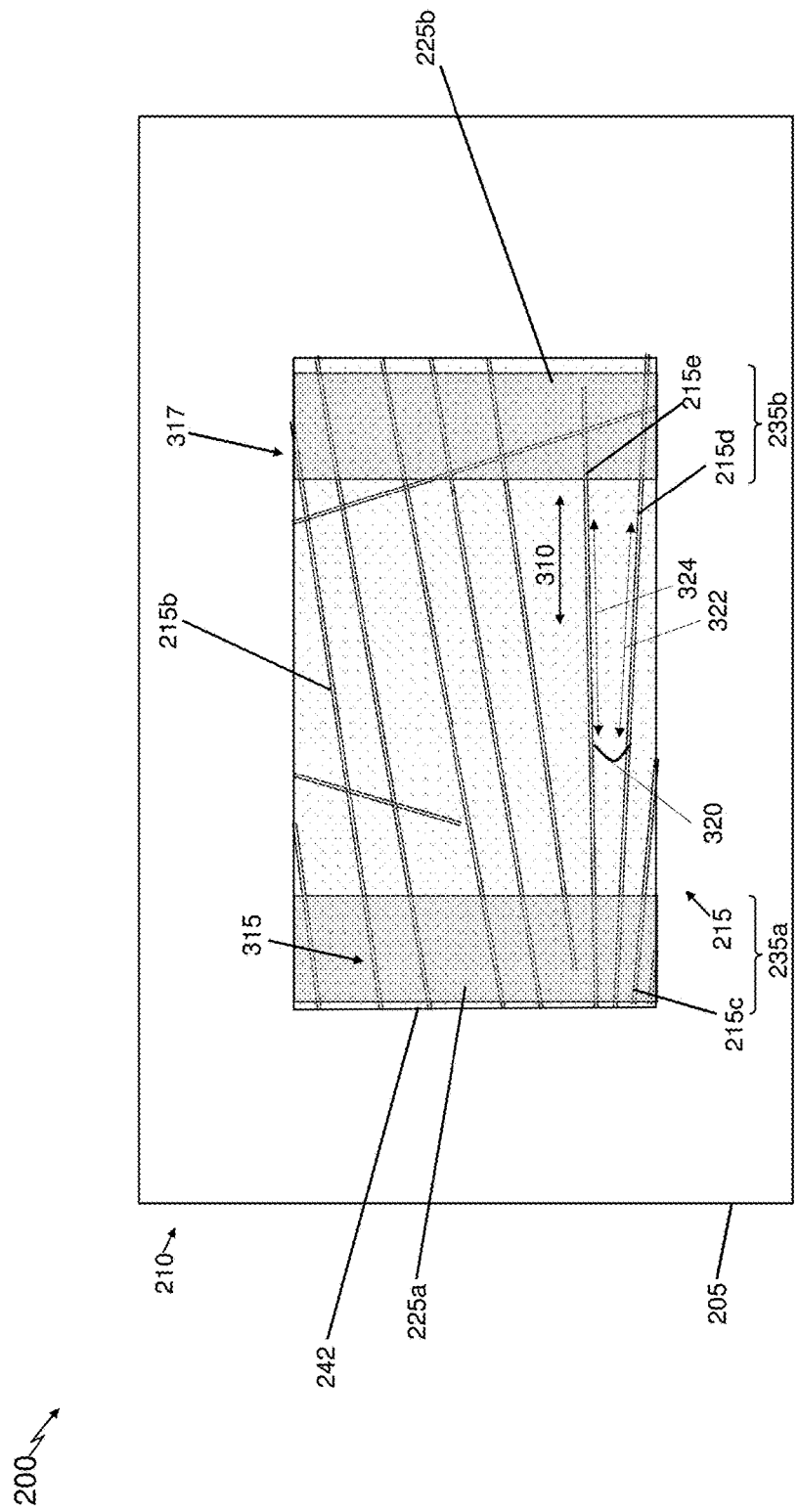
Figure 3G:
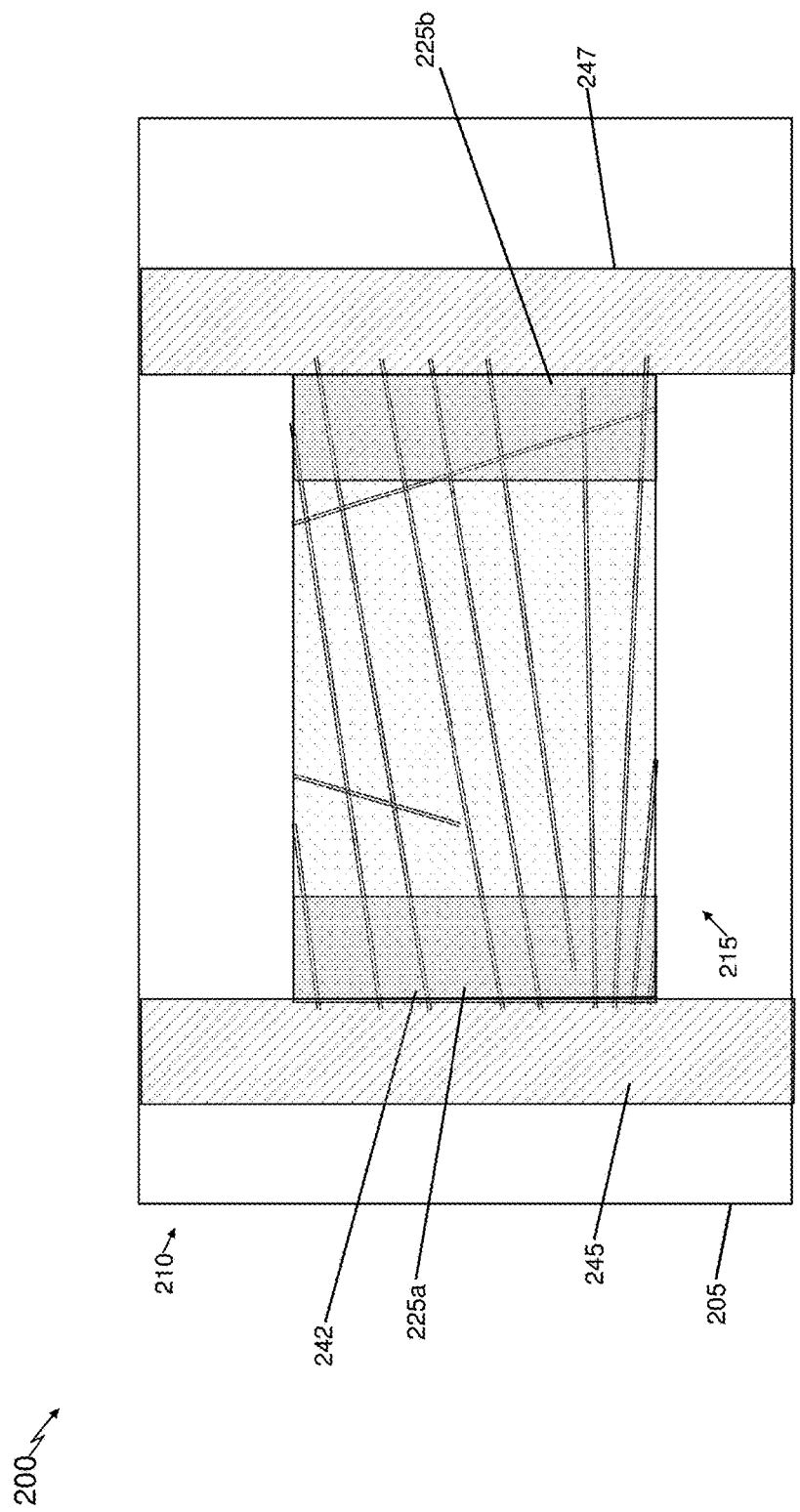
Figure 3H:
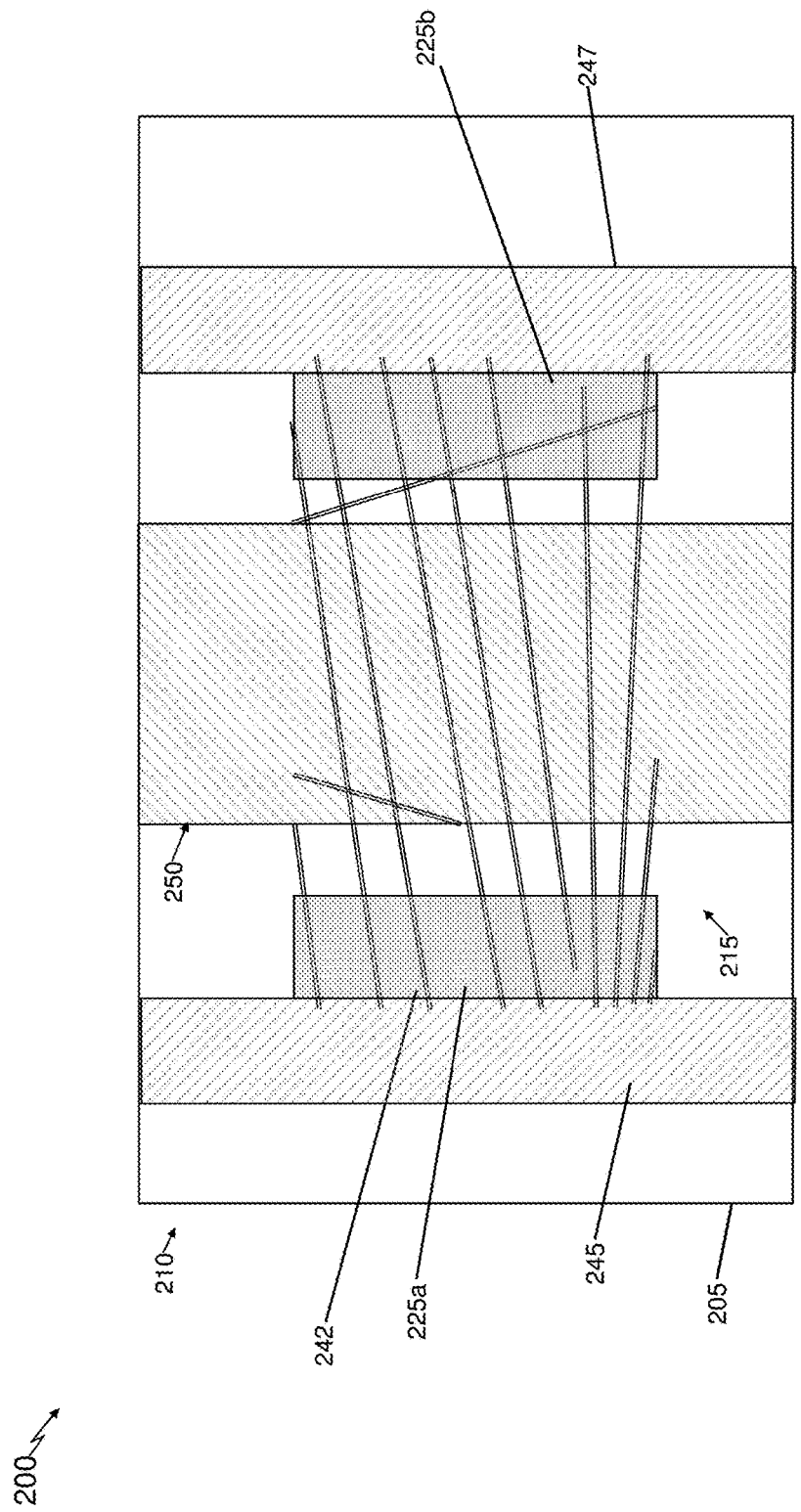

The term electrically conductive carbon nanotubes refers to the carbon nanotubes that directly span the source and drain electrode contacts of the transistor, such that one end region of the carbon nanotube directly contacts the source electrode contact and an opposite end region of the same carbon nanotube directly contacts the drain electrode contact. For example, as illustrated in FIG. 3F, one end region 315 of carbon nanotube 215b contacts the pin-down anchor layer 225a configured as the source electrode contact and an opposite end region 317 of this same carbon nanotube 215b contacts the pin-down anchor layer 225b configured as the drain electrode contact. Therefore carbon nanotube 215b is considered an electrically conductive carbon nanotube. In contrast, one end of carbon nanotube 215c contacts the pin-down anchor layer 225a but the opposite end of carbon nanotube 215c does not contact the other pin-down anchor layer 225b. Therefore carbon nanotube 215c is not considered to be an electrically conductive carbon nanotube.

The term aligned carbon nanotubes refers to the long axis of the individual carbon nanotubes being co-linear with each other (e.g., in the common alignment direction 310 between pin-down anchors layers 225a and 225b) such that an alignment angle between carbon nanotubes is within about ±20 degrees (average±SD) for adjacent ones of the carbon nanotubes. For example as illustrated in FIG. 3F, an angle 320 between the average long axis length dimensions, 322, 324 of individual adjacent carbon nanotube 215d and 215e, respectively, can be within about ±20 degrees. In some embodiments, the alignment angle can be within about ±10 degrees or within about ±5 degrees, with consequent desirable increased electrical conductivity through the CNT layer 215. In some embodiments, an average angle between the individual electrically conductive carbon nanotubes of the CNT layer 215 and the common alignment direction 310 can be within about ±20 degrees or within about ±10 degrees or within about ±5 degrees.

As noted above, at least 40 percent of the electrically conductive aligned carbon nanotubes are discrete from any carbon nanotubes of the CNT layer.

The term, any carbon nanotubes, refers to the totally of all carbon nanotubes present in the CNT layer (e.g., FIG. 3F, CNT layer 215), including electrically conductive and non-conductive carbon nanotubes (i.e., carbon nanotubes that do not directly span the source and drain electrode contacts) and aligned or non-aligned carbon nanotubes (i.e., adjacent ones of the carbon nanotubes having an alignment angle of greater than ±20 degrees).

The term, discrete, refers to a cumulative fraction of the electrically conductive aligned carbon nanotubes having an apparent diameter in the cross-sections (e.g., cumulative fractions from a plurality of cross-sections 305a-305a, 305b-305b, 350c-305c . . . ) that on average is in a range from a minimum diameter to a maximal diameter of an individual one carbon nanotube of the CNT layer 215.

The apparent diameter of individual carbon nanotubes can be measured experimentally (e.g., from a test device 200 taken from a batch fabrication run applying the method 100) by an atomic force microscopy (AFM) tapping method such as disclosed in the experimental results section herein and as familiar to those skilled in the pertinent art. The maximal diameter can be experimentally determined, e.g., by Raman spectroscopy or by AFM measurements conducted on a low-density deposited CNT layer (e.g., a density of no more than 1 carbon nanotube per square micron of substrate surface), as familiar to those skilled in the pertinent art. The minimum diameter can be set as a theoretical minimal diameter of the carbon nanotube which is stable to oxidation in an air environment at room temperature (e.g., in some embodiments, minimal diameter of about 0.8 nm for single walled carbon nanotubes).

In particular, the discrete electrically conductive aligned carbon nanotubes are not bundled and are not substantially crossing any other carbon nanotubes of the CNT layer such that the apparent diameter in the cross-sections would be greater than the maximal diameter.

The term, bundled, means that two carbon nanotubes adhere to each other (e.g., via van der Waals forces) such that at least about 10 percent of the length of the electrically conductive aligned carbon nanotubes in the first portion 230 of the CNT layer 215 directly contacts (e.g., touches) an adjacent carbon nanotube of the CNT layer 215. The term, substantially crossing, means an at least about 1 percent of the length of the electrically conductive aligned carbon nanotubes in the first portion 230 of the CNT layer 215 passes under or over any other carbon nanotube of the CNT layer 215 (e.g., 1.5 nm length of a 160 nm total length carbon nanotube). Either crossing or bundled carbon nanotubes have an apparent diameter that is greater than the maximum diameter of an individual one of the electrically conductive aligned carbon nanotubes.

Non-limiting examples of the substrate material include: semiconductors such as silicon (with any doping type and level), silicon carbide, gallium nitride, indium phosphide, gallium arsenide); non-oxide insulators such as diamond, boron nitride, silicon nitride, aluminum nitride; oxide insulators such as $SiO_2$, quartz, $Al_2O_3$, sapphire, $HfO_2$, $ZrO_2$, $Y_2O_3$, $CeO_2$, $Ta_2O_5$, $TiO_2$, $Nb_2O_5$ or other suitable dielectric materials; polymers such as polyethylene naphthalate (PEN), polyethylene terephthalate (PET), polydimethylsiloxane (PDMS), polyimide (PI), parylene-C, poly(4-vinylphenol) (PVP), poly(methyl methacrylate) (PMMA), epoxy (e.g., SU-8), or others flexible polymers.

As part of providing the substrate, step 105, can include depositing the substrate material using thermal growth, atomic layer deposition, electron-beam evaporation, chemical vapor deposition, or sputtering. In some embodiments, the substrate is provided as a silicon wafer with a thermally grown silicon oxide layer thereon. In some embodiments, the substrate can be quartz wafers, as single crystal quartz or as fused silica quartz. In some embodiments, as part of providing the substrate, the substrate surface 207 can be partly or fully functionalized with molecular moieties, by design (e.g., functionalized with $Si(CH_3)_3$ from a hexamethyldisilazane, HMDS, surface treatment) or inadvertently from contaminants.

Non-limiting examples of forming the CNT layer on the substrate surface as part of step 115 include depositing a solution of CNTs suspended in a solvent on the substrate surface, removing the solvent of the solution to thereby leave the carbon nanotube on the substrate. In some embodiments, the substrate may include a sacrificial layer such as described in U.S. patent application Ser. No. 16/199,913 to Cain et el., and incorporated by reference herein in its entirety. In some embodiments, the carbon nanotubes of the CNT layer can be grown on the substrate surface directly from catalysts using chemical vapor deposition. The carbon nanotubes of the CNT layer can also be deposited directly from fluid, including gases or solvents, flowing over the surface of the wafer, or, be deposited on a different separate substrate using any of the above described procedure and then and transferred to the device substrate 205 using sacrificial transfer layers as familiar to those skilled in the pertinent art.

Non-limiting examples of carbon nanotubes that can be part of the CNT layer include single-walled CNTs, double-walled CNTs and in some embodiments, substantially (e.g., at least about 95 percent, about 98 percent or about 99 percent, in some embodiments) semiconducting single-walled CNTs. In some embodiments, the single-walled carbon nanotube can be wrapped in a polymer. Non-limiting example polymers include polyfluorene derivatives disclosed by Arnold, et al. (U.S. Pat. No. 9,425,405, incorporated by reference herein in its entirety). In some embodiments, the density of the CNTs in the CNT solution can range from 1 microgram CNTs per milliliter of the solution to 25 microgram CNTs per milliliter of the solution.

Non-limiting examples of the pin-down layer materials include electrically conductive materials such as palladium, gold, platinum, yttrium, scandium, titanium, nickel, chromium, cobalt, or multilayer or alloy combinations thereof. In some embodiments, the pin-down layer material can be non-electrically conductive, such as positive, negative or lift off resist materials such as PMMA, ZEP or [0001]-SU-8, or any of the materials of the protective layer as disclosed herein, fluorocarbons, or oxides such as $SiO_2$, quartz, $Al_2O_3$, sapphire, $HfO_2$, $ZrO_2$, $Y_2O_3$, $CeO_2$, $Ta_2O_5$, $TiO_2$, $Nb_2O_5$.

In some embodiments, as part of step 120, depositing the pin-down layer can include e-beam evaporation of any of the above-described metal. In other embodiment depositing the pin-down layer can include spinning on the material of the pin-down layer dispersed in solvent and then baking to remove the solvent, or evaporation (e.g., thermal and electron-beam), sputtering, atomic layer deposition, or chemical vapor deposition.

In some embodiments, as part of step 125, patterning the pin-down layer to form the anchor layers includes electron beam or photo lithography, including depositing and patterning a resist layer into a positive of the final pattern, and etching the pin-down layer using fluids and then removing the patterned resist. In some embodiments, the pattern may be written by electron beam lithography directly, with the pin-down layer itself serving as a layer of e-beam resist, and the unwanted portions removed using developers.

Non-limiting examples of protective layer material include alumina ($Al_2O_3$), aluminum, PMMA, gold, titanium, molybdenum, molybdenum oxide, tungsten oxide, chromium, silicon oxide ($SiO_2$) or other materials that can be similarly wet-etched but are otherwise chemically inert, i.e., material that would not be etched during an etching processing step. In some embodiments, ZnO and $MoO_3$ are not suitable protective layer materials because they can rapidly be etched when exposed to developer solution or to water.

In some embodiments, as part of step 130, depositing the protective layer includes atomic layer deposition (ALD) (e.g., a protective layer alumina particularly because this material is readily wet-etchable, or evaporation (e.g., a protective layer of evaporated gold).

In some embodiments as part of step 135, patterning to remove the third different portions of the CNT layer can include resist deposition and photolithographic or electron beam lithography patterning of a photoresist material such as nLOF5500 or SPR700 or a e-beam resist material such as polymethyl methacrylate (PMMA) followed by etching using an $O_2$ plasma oxidative dry etch process.

In some embodiments, an e-beam resist material and electron beam lithography patterning, as part of step 135, which can beneficially leave less resist residue than photoresists and photolithographic patterning.

Non-limiting examples of source and drain electrode wires material include Pd Pt or Au to make an ohmic, p-type contact to the CNTs. Other wiring materials can include Ti/Au due to its low resistivity (with a Ti layer serving an adhesion layer for an Au layer).

For example, in some embodiments, forming the source and drain electrode wires as part of step 140 includes depositing the source and drain electrode wires material and patterning the material by electron beam lithography. For example, a substrate wafer can be coated with photoresist, such as nLOF5500, exposed with the appropriate pattern and developed to realize that pattern on the wafer. Material such as Ti and Au can be deposited by e-beam evaporation onto the wafer. A liftoff process removes the patterned resist and consequently the material deposited on top of it leaving only the material deposited on the substrate.

Non-limiting examples of gate electrode structure material include gate electrode materials of Al or Ti and Au, and gate insulator materials such as $Al_2O_3$, $HfO_2$ or $ZrO_2$.

For example, in some embodiments, forming the gate electrode structure as part of step 145 includes spin coating a material such as PMMA in a trilayer stack and patterning the material by electron beam lithography followed by developing the pattern. The pattern used can be used to define a T-gate or as a 'brick-gate' gate electrode. A material, such as Al or Ti and Au, can be deposited by e-beam evaporation onto the pattern and subsequently lifted-off.

In some embodiments, all or a portion of the protective layer, can be removed before or as part of step 135, 140 or 145, e.g., to expose the third different portion the CNT layer for subsequent removal or to permit direct contact to the source and drain electrode wires or the gate electrode structure. For example, in some embodiments, removing a protective layer of $Al_2O_3$ can include a wet-etch using a phosphoric acid:water (1:40) mixture at 55° C. For example, in some embodiments, removing a protective layer of Au can include a wet-etch using potassium iodide/idodide solutions.

As noted above, in some embodiments, the pin-down layer, and subsequent pin-down anchor layers, can be composed of an electrically non-conductive material. In such embodiments, the method 100 can further including forming source and drain electrode contacts (e.g., FIG. 1 step 150). For instance, after patterning to remove the third different portion the CNT layer in step 135, source and drain electrode contacts can be formed in step 150 such that the source electrode contact contacts the one end region of the individual electrically conductive aligned carbon nanotubes corresponding to one of the second portions of the CNT layer (e.g., FIG. 2F, second portion 235a) and the drain electrode contact contacts an opposite end region of a same one of the individual electrically conductive aligned carbon nanotubes corresponding to a remaining one of the second portions of the CNT layer (e.g., FIG. 2F, second portion 235b).

Non-limiting examples of such source and drain contact materials include any of the conductive materials used to form the conductive pin-down layer or the source and drain electrode wires. For example, in some embodiments, forming the source and drain electrode contacts as part of step 150 includes spin-coating a dual-layer of 495PMMA and 950PMMA resist onto the wafer, exposing the pattern using e-beam lithography, depositing by e-beam evaporation a contact material, such as Pd for p-type CNTs, onto the wafers, followed by liftoff which removes the patterned PMMA material deposited on top of it.

The method 100 can then proceed as previously described, e.g., by then forming source and drain electrodes wires on the substrate surface in accordance with step 140 and then forming the gate structure in accordance with step 145.

As further illustrated in FIG. 1, some embodiments of the method 100 can further include the use of a transient pin-down layer to facilitate the formation of the device.

The term, transient pin-down layer, means a layer that performs the same function and includes the above-described pin-down layer or pin-down anchor layers, but, which is not part of the completed device. That is, the transient pin-down layer is removed before the device's completion and in some embodiments as further illustrated in the context of the cross-sectional views shown in FIGS. 4A to 4F, removed as part of steps for forming the pin-down anchor layers of the device 200.

Embodiments of transient pin-down layer 405 can be composed of the same materials and depositing can be the same as described above in the context of FIGS. 1 and 2C for the pin-down layer 220 and its depositing step 120.

Figure 4A:
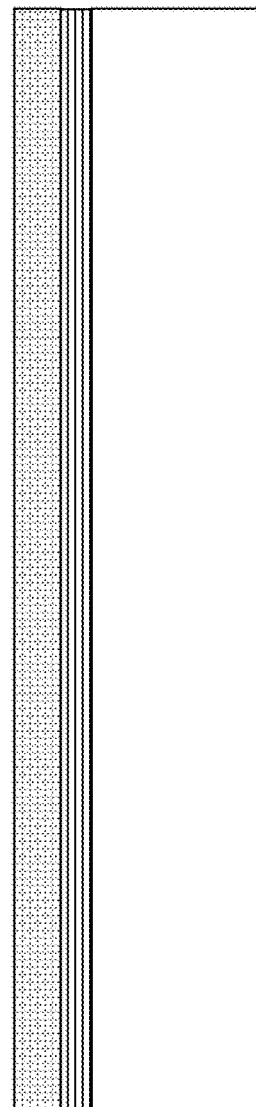

With continuing reference to FIGS. 1-4F throughout, some such embodiments of forming the radiofrequency field effect transistor (step 110) can further include depositing a transient pin-down layer on the CNT layer 215, where the transient pin-down layer directly covers the CNT layer 215 (e.g., FIG. 1, step 155, FIG. 4A, transient pin-down layer 405). The transient pin-down layer is deposited after forming the CNT layer (e.g., step 115, FIG. 2B, CNT layer 215) but before the depositing the pin-down layer (e.g., step 120, FIG. 2C, pin-down layer 220) and the patterning of the pin-down layer to form the pin-down anchor layers (step 125, FIG. 2D pin-down anchor layers 225a, 225b).

In some embodiments, such as when the transient pin-down layer is composed of an electron beam resist material, the patterning of the transient pin-down layer (e.g., portions 415a, 415b) to expose the second portions of the CNT layer can be done directly in step 157 (e.g., via e-beam lithography) without the need to deposit and pattern another resist layer in accordance with steps 160 and 165.

Figure 4B:
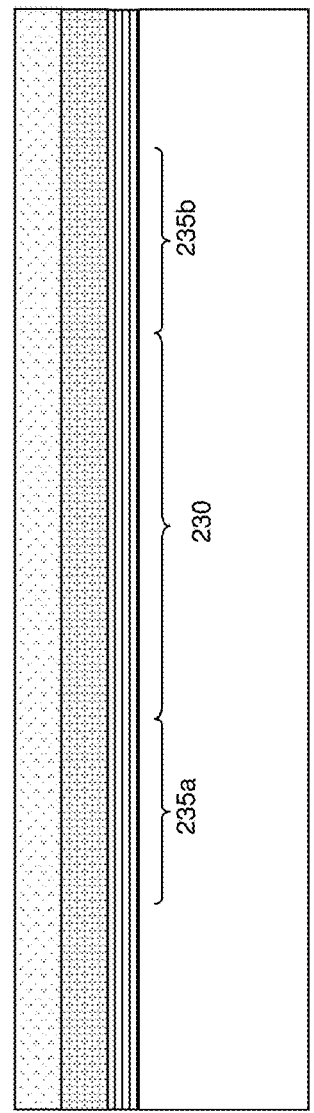

Alternatively, some embodiments can further include depositing a resist layer (e.g., photoresist or other electron beam resist) on the transient pin-down layer where the resist layer covers the transient pin-down layer (e.g., FIG. 1, step 160, FIG. 4B, resist layer 410).

Figure 4C:
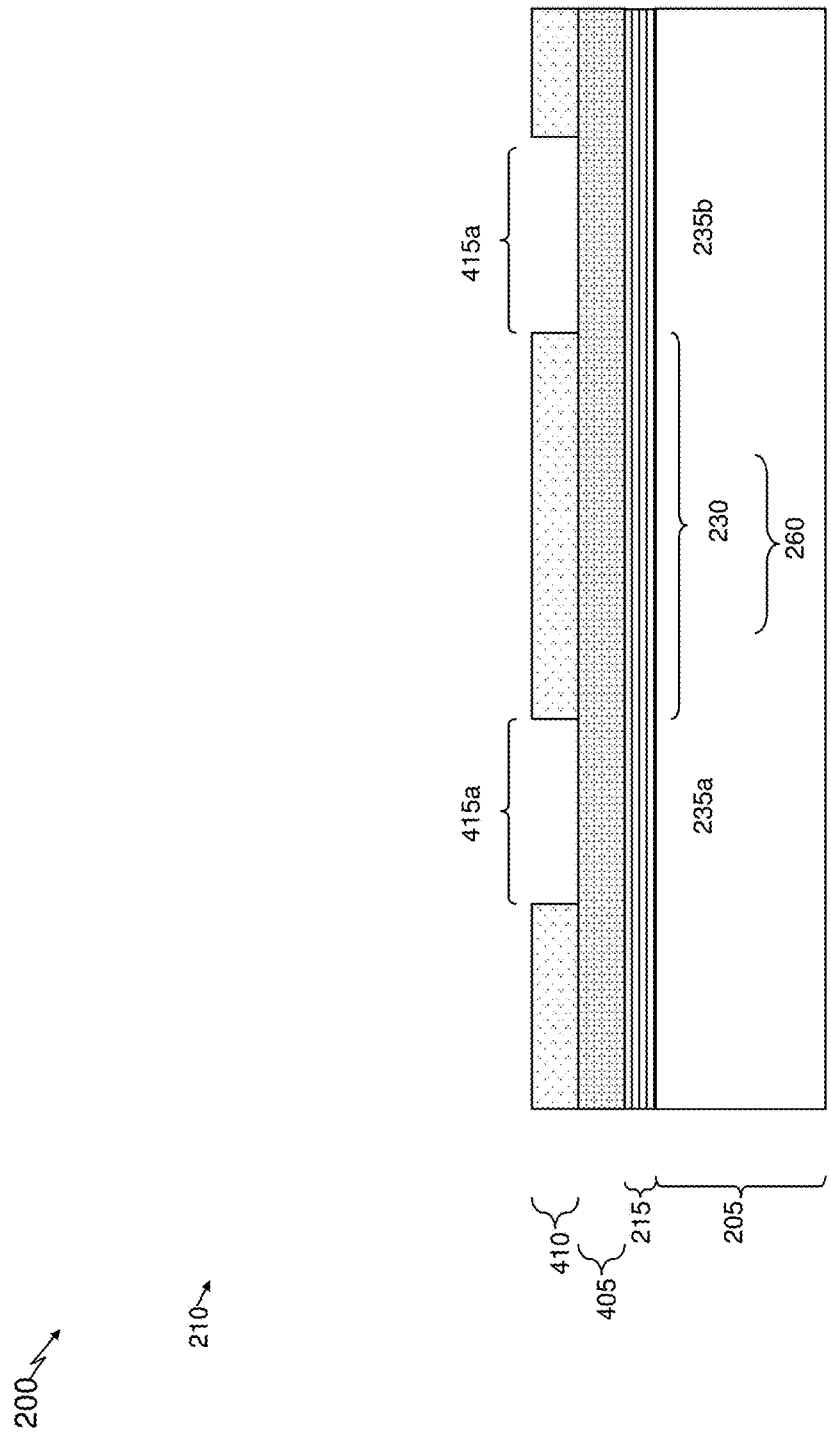

Such embodiments can further include patterning the resist layer to uncover portions (e.g., FIG. 1, step 165, FIG. 4C, two separate uncovered portions 415a, 415b) of the transient pin-down layer that lay directly over the second portions of the CNT layer (e.g., FIG. 4C. second portions 235a, 235b of CNT layer 215, respectively).

Figure 4D:
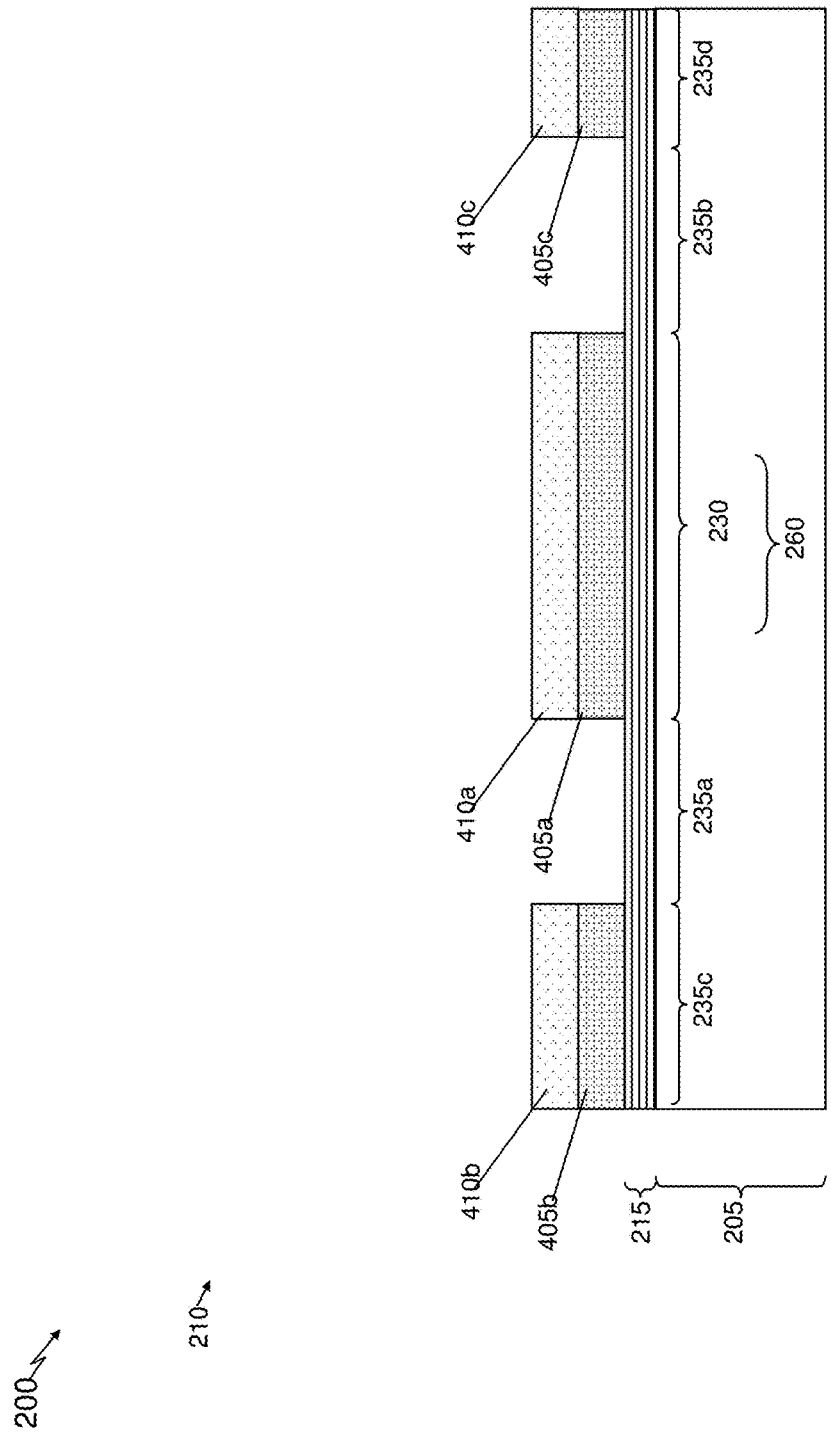

Such embodiments can further include patterning portions of the transient pin-down layer (e.g., the uncovered portions 415a, 415b) to expose the second portions of the CNT layer (e.g., FIG. 1, step 157, FIG. 4D, second portions 235a, 235b of CNT layer 215). As illustrated, a remaining portion of the resist (e.g., portion 410a) and a remaining portion of the transient pin-down layer (e.g., portion 405a) cover the first portion of the CNT layer (e.g., first portion 230). Other remaining portions of the resist (e.g., remaining resist portions 410b, 410c) and the transient pin-down layer (e.g., remaining transient pin-down layer portions 405b, 405c) can cover the third different portion the CNT layer (e.g., CNT portions 235c and 235d).

Any such embodiments can then further include the depositing of the pin-down layer and the patterning of the pin-down layer to form the pin-down anchor layers in accordance with steps 120 and 125, respectively.

Figure 4E:
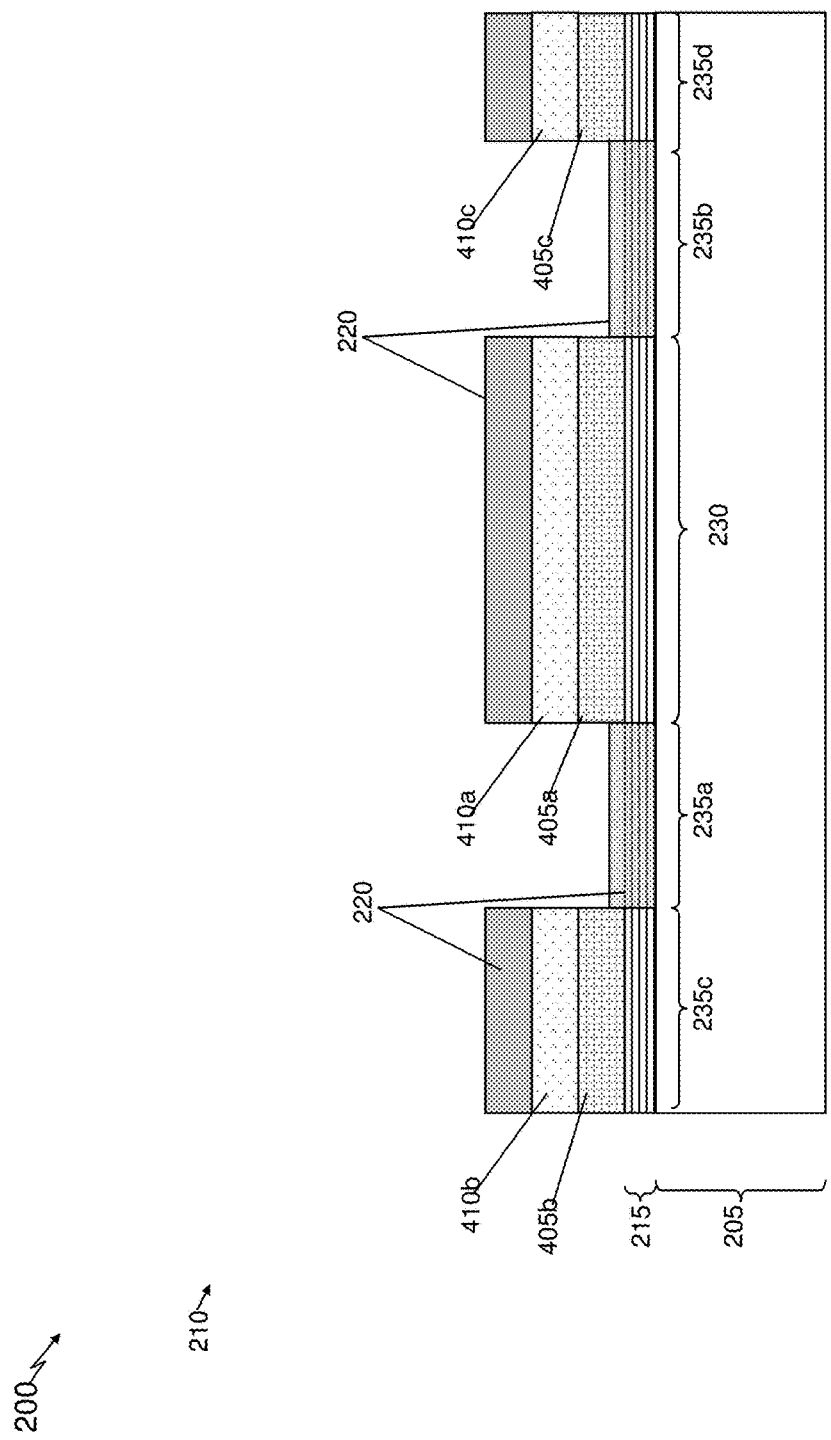

For instance, FIG. 4E shows the device after depositing the pin-down layer (step 120), which can include depositing the pin-down layer to cover the exposed second portions of the CNT layer and the remaining portions of the transient pin-down layer, and resist, when used, (e.g., FIG. 1, step 175, FIG. 4E, pin-down layer 220, second CNT portions 235a, 235b, the remaining transient pin-down layer portions 405a-405c and remaining transient resist portions 410a-410c).

Figure 4F:
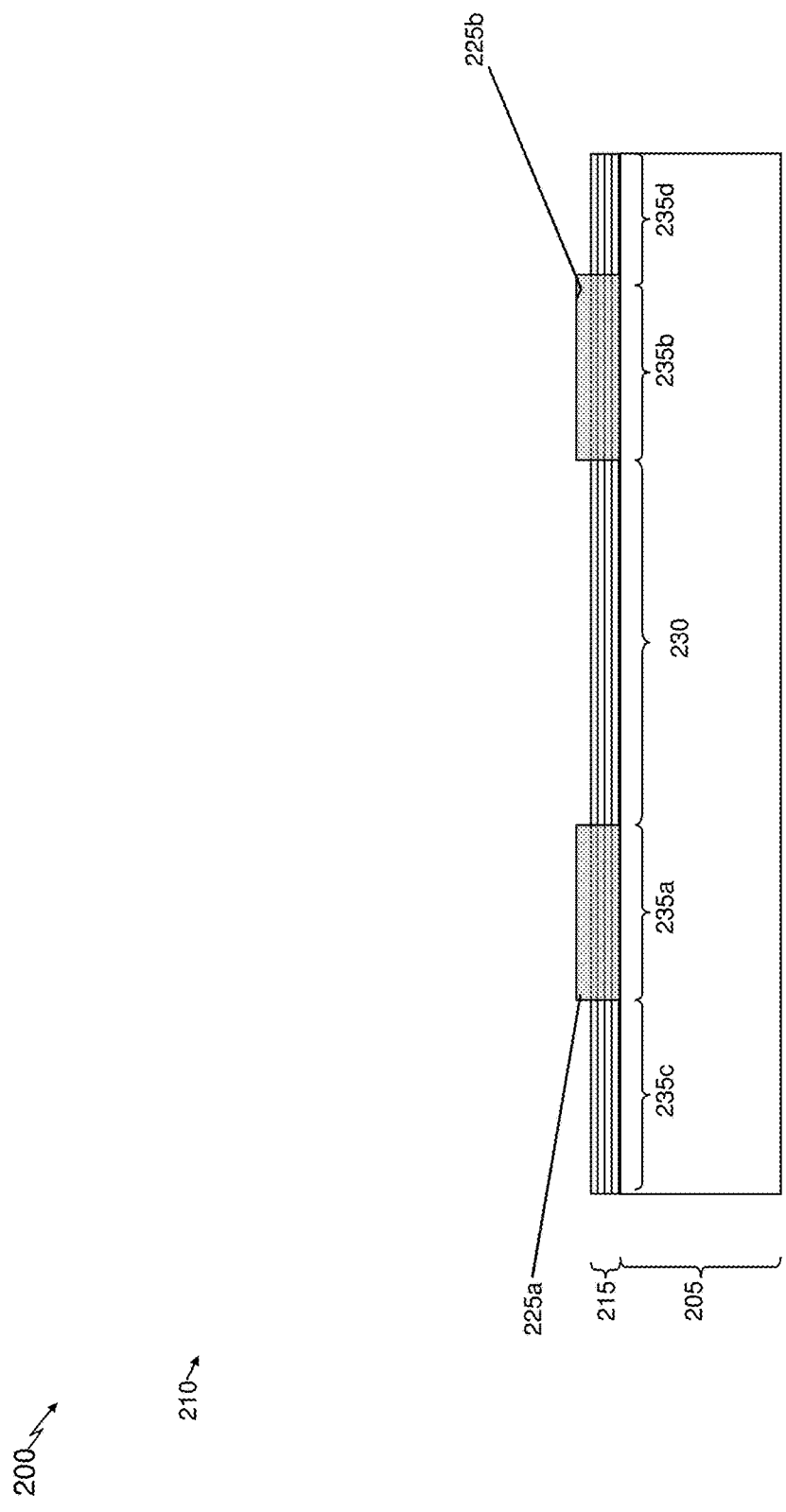

For instance, FIG. 4F shows the device 200 after the patterning of the pin-down layer which can include performing a liftoff process to remove the remaining resist, when used, (e.g., remaining resist portions 410a-410c) and the remaining transient pin-down layer portions (e.g., remaining transient pin-down layer portions 405a-405c) to thereby expose the first portion of the CNT layer (e.g., FIG. 1, step 180, FIG. 4F first portion 230). For instance, the liftoff process can include exposing the remaining resist portion, when used, and the remaining transient pin-down layer portions to an organic solvents (e.g., n-methyl-2-pyrrolidone, acetone solvents for some embodiments), without stripping away the pin-down layer 220 portions deposited directly on the second CNT portions 235a, 235b.

The device 200 depicted in FIG. 4F is substantially at a same stage in the method 100 as depicted in FIG. 2D and therefore the device's manufacture can be further processed via the same steps 130-150 as described elsewhere herein in the context of FIG. 1 and FIGS. 2E-2H.

Another aspect of the disclosure is an electrical device, such as any of the devices disclosed herein as disclosed in the context of FIGS. 1-4F. For instance, as illustrated in FIG. 2H with continuing reference to FIGS. 1-4F, embodiments of the device 200 can include a substrate 205 having a surface 207 and a CNT layer 215 on the substrate surface 207, the CNT layer including electrically conductive aligned carbon nanotubes (e.g., FIG. 3F electrically conductive carbon nanotubes 215b, 215d, 215e aligned in common direction 310 between pin-down layers 225a, 225b). The device 200 further includes pin-down anchor layers 225a, 225b on the CNT layer 215. A first portion 230 of the CNT layer 215, located in-between the pin-down anchor layers 225a, 225b, is not covered by the pin-down anchor layers and is a channel region of the radiofrequency field effect transistor. Second portions 235a, 235b of the CNT layer 215 are covered by the pin-down anchor layers 225a, 225b.

For cross-sections in a direction perpendicular to a common alignment direction of the electrically conductive aligned carbon nanotubes in the first portion of the CNT layer (e.g., cross-sections 305a-305a, 305b-305b, 305c-305c perpendicular to common alignment direction 310): the electrically conductive aligned carbon nanotubes have an average linear density in a range from 20 to 120 nanotubes per micron along the cross-section, and at least 40 percent of the electrically conductive aligned carbon nanotubes are discrete from any carbon nanotubes of the CNT layer.

In some such embodiments, the electrically conductive aligned carbon nanotubes have an average linear density in a range from 30 to 60 nanotubes per micron along the cross-section.

In some embodiments, an average linear density of greater than 100 or greater than 120 or greater than 150 nanotubes per micron along the cross-section can result in a device where substantial electrical shielding can occur, even with the pin-down anchor layers on the CNT layer.

In some such embodiments, at least 50 percent and in some embodiments at least 70 percent and in some embodiments at least about 90 percent, of the electrically conductive aligned carbon nanotubes are discrete from any carbon nanotubes of the CNT layer.

In some such embodiments, the pin-down anchor layers can be separated by a distance 270 in a range from 5 to 500 nm, and in some embodiments 100 to 400 nm or from 200 to 300 nm. In some embodiments at separation distances of greater than 300 nm or greater than 400 nm, or greater than 500 nm, even with the pin-down anchor layers on the CNT layer, the carbon nanotubes can still have enough translational motion across the substrate surface for substantial bundling between carbon nanotubes of the CNT layer to occur (e.g., greater than 10 percent or greater than 20 percent of the mean length of the carbon nanotubes). In some embodiments, the pin-down anchor layers are separated by a distance 270 that is no greater than the mode length of the CNT layer length-distribution. Solution processed carbon nanotubes are often characterized by a log-normal length distribution where the mean length is greater than the mode length. For example, some sources of carbon nanotubes are tip-sonicated carbon nanotubes, which can have a 300 nm mode length, while other sources of carbon nanotubes are shear-force-mixed nanotubes, which can have a 470 nm mode length.

In some such embodiments, the pin-down anchor layers 225a, 225b can be composed of an electrically conductive material and can thereby serve as source and drain electrode contacts of the radiofrequency field effect transistor. In such embodiments the source electrode contact (e.g., FIG. 3F, one of pin-down anchor layer 225a or 225b) contacts one end region (e.g., one of end region 315 or 317, respectively) of the electrically conductive aligned carbon nanotubes (e.g., carbon nanotube 215b) corresponding to one of the second portions (e.g., one of portions 235a or 235b, respectively) of the CNT layer. The drain electrode contact (e.g., FIG. 3F, the other one of pin-down anchor layer 225b or 225a) contacts an opposite end region (e.g., the other one of end region 317 or 315, respectively) of a same one of the electrically conductive aligned carbon nanotubes (e.g., same carbon nanotube 215b) corresponding to a remaining one of the second portions of the CNT layer (e.g., the other one of portions 235b or 235a, respectively). In such embodiments, the separation distance 270 between the pin-down anchor layers 225a or 225b is equal to the length between the source and drain ($L_{SD}$).

In some such embodiments, the device 200 further includes source and drain electrode wires 245 of the radiofrequency field effect transistor 210. The source and drain electrodes wires 245, 247 re located on the substrate surface 207 and the source electrodes wire 245 contacts the source electrode contact (e.g., one of pin-down anchor layer 225a or 225b) and the drain electrode wire contacts 247 the drain electrode contact (e.g., the other one pin-down anchor layer 225b or 225a.

In some such embodiments, the device 200 further includes a gate electrode structure 250 of the radiofrequency field effect transistor 210. As understood by those skilled in the pertinent art gate electrode structure 250 can be configured to generate an electric field capable of altering the resistivity of the CNT layer 215, such that the CNT layer 215 serves as a channel region of the transistor 210.

Embodiments of the gate electrode structure 250 can be located on a central part 260 of the first portion 230 of the CNT layer 215. In some such embodiments, a width 275 of a gate electrode 252 and a gate insulator 255 of the gate electrode structure 250 that overlay the central portion 260 can be a value in a range from 10 percent to 90 percent of a length 270 between the source and drain contacts (e.g., pin-down anchor layer 225a, 225b). In some embodiments the gate electrode 252 of the gate electrode structure 250 can be configured as T-gate electrode or a brick gate electrode (e.g., a metal T-gate or brick gate electrode). In some embodiments, the gate structure 250 can be configured to control two different transistors (e.g. n- and p-field effect transistors) to provide a CNT-FET device 200.

In some alternative embodiments, the pin-down anchor layers 225a, 225b can be composed of an electrically non-conductive material and therefore the transistor 210 further includes source and drain electrode contacts 280a, 280b. The source and drain electrode contacts 280a, 280b can be located on the substrate surface 207. The source electrode contacts 280a is located such that it contacts one end region of the individual electrically conductive aligned carbon nanotubes corresponding to one of the second portions of the CNT layer (e.g., FIG. 3F end region 315 of carbon nanotube 215b in second portion 235a). The drain electrode contacts 280b is located such that it contacts an opposite end region of a same one of the individual electrically conductive aligned carbon nanotubes corresponding to a remaining one of the second portions of the CNT layer (e.g., FIG. 3F end region 317 of carbon nanotube 215b in second portion 235b). In such embodiments, the separation distance 285 between the source and drain electrode contacts 280a, 280b is equal to the length between the source and drain ($L_{SD}$).

In some such embodiments, source and drain electrodes wires 245, 247 of the transistor 210 are located on the substrate surface 207 such that the source electrodes wire 245 contacts the source electrode contact 280a and the drain electrode wire 247 contacts the drain electrode contact 280b.

As noted the presence of the pin-down anchor layers on the CNT layer, to keep electrically conductive aligned carbon nanotubes discrete and at desired linear density range, can facilitate the manufacture of radiofrequency field effect transistors having a number of superior electrical properties.

For instance in some embodiments, embodiments of the radiofrequency field effect transistor 210 can have an on-off ratio value (e.g., a ratio $I_{on}/I_{off}$, of an on-state current, $I_{on}$, and off-state current $I_{off}$ of the transistor) in a range of 5:1 to 1000:1, and in some embodiments, 5:1 to 100:1, and in some embodiments, 50:1 to 100:1 and in some embodiments, 75:1 to 100:1. In some embodiments of the device 200, the on-off ratio value can be in a range of 200:1 to 1000:1.

For instance in some embodiments, embodiments of the radiofrequency field effect transistor 210 can have transconductance value (e.g., a ratio $\Delta I_d/\Delta V_g$ of the unit ampere change in drain current, $\Delta I_d$, per unit change in gate voltage, $\Delta V_g$) in a range from 100 to 1200 mS/mm, and in some embodiments, from 100 to 250 mS/mm or 200 to 250 mS/mm.

Unlike the incumbent technologies, such as High Electron Mobility Transistors, that create charge-confinement within a bulk material via a heterostructure-derived two-dimensional electron gas layer, charges are naturally confined in one-dimensional CNTs which leads to desirable transport characteristics. For example, quasi-ballistic transport has been observed for tube lengths of 300 nm which is a direct consequence of its reduced scattering degrees of freedom. Empirically observed high current density and transconductance values up to 25 µA and 20-40 µS have been reported for single tube measurements which, upon scaling into dense arrays, would exceeds that of the incumbent technologies. Both theoretical and empirical work suggests that this 1D charge transport allows CNT-FETs to achieve highly linear signal amplification. Modern wireless technology increasingly relies on highly linear devices to achieve spectral-efficient modulation (more data per-unit bandwidth) and high spurious-free dynamic range for extracting weak signals from the ever more congested airwaves. Achieving such high-linearity at low DC power levels would be a further advantage particularly for power constrained applications.

Aspects of embodiments of the disclosure are further presented in the Experimental Results section to follow:

Experimental Results

A prototype radio frequency field effect transistor (e.g., a RF CNT-FET) of the disclosure was constructed, in according with the method disclosed in the context of FIG. 1, with the T-gate structure commonly used in III-V HEMT devices. An ASML5500-200 i-line stepper was used to pattern the CNT area, co-planar waveguide (CPW), and probe pads. Unwanted CNTs outside of the device channel were etched by low-power $O_2$ plasma. Metallization of the CPW layer was performed by e-beam evaporation of Ti/Au (50 nm/200 nm) for the drain and source wiring/pads and Ti/Au/Ni (50 nm/200 nm/10 nm) for the gate wiring/pad. Both the contact layer and T-gate were patterned by electron beam lithography (EBL), with the patterns written using a 100 keV Vistec EBPG 5000+ES with the contact pad formed from a bilayer PMMA process while the T-gate was patterned via a trilayer resist process. Metalized contact-electrodes consisted of 35 nm of electron-beam evaporated Pd while the T-gate metal-stack was Al/Ni/Au (60 nm/30 nm/150 nm). A protective layer was applied the wafer prior to the spin-coating of all photoresist steps.

FIG. 5 presents an example atomic force microscopic image of a portion of the CNT layer formed as described above. For clarity, the orientation of the CNT layer relative to the positions of the source and drain electrical contacts (not shown, but, corresponding to pin-down anchor layers 225a, 225b in FIGS. 2H and 3H) and the common alignment direction 310 of the carbon nanotubes between the source and drain electrical contacts, are shown.

CNTs were deposited on a wafer substrate surface that was cleaned and surface treated. A Bruker Dimension Fast-Scan atomic force microscopic was used to acquire the image in tapping mode, using a new FastScan A tip. The AFM head was navigated to near the center of the wafer. Parameters included: Scansize—500 nm; Rate: 2 Hz; Resolution—256 samples/line×256 lines; I=0.07, P=0.5.

FIG. 6 presents an example tapping mode linescan profile of carbon nanotube heights as measured for one cross-section of the example atomic force microscopic (AFM) image shown in FIG. 5 (e.g., cross-section 305 shown in FIG. 5). As familiar to those skilled in the pertinent arts, AFM in tapping mode can be used to measure carbon nanotube heights on the substrate (e.g., z, corresponding to image intensity) versus position (e.g., x, corresponding to a direction perpendicular to the common alignment direction 310) to give a profile of carbon nanotube height distributions across the linescan.

As shown in FIG. 6, the heights of carbon nanotubes are shown in units of nm and corresponds to an apparent diameter of the carbon nanotubes on the substrate surface. The maximal and minimal diameter of individual ones of the single walled carbon nanotubes was estimated to be 2.2 nm and 0.8 nm, respectively. Accordingly, the peaks in the linescan having heights of greater than 2.2 nm were considered to be bundled or crossing carbon nanotubes and the peaks in the linescan having heights of greater from 0.8 to 2.2 nm were considered to be discrete carbon nanotubes. For the example tapping mode linescan shown in FIG. 6, of a total of 16 carbon nanotubes, 9 are discrete, 7 are bundled or crossing. Consequently the fraction of discrete carbon nanotubes in the line scan of the depicted cross-section 305 equals 0.56 (e.g., 9/16).

FIG. 7 presents a histogram of carbon nanotube heights as measured from a plurality of tapping mode linescan profiles of the carbon nanotubes such as illustrated in FIG. 6 (e.g., the accumulation of linescan height profiles for four different cross-sections analogous to cross-section 305 shown in FIG. 5 but at different locations though the lengths of the carbon nanotubes). As illustrated the cumulative fraction of discrete carbon nanotubes at the 2.2 nm cutoff equaled 0.71.

FIG. 8 presents a histogram of carbon nanotube heights as measured from a plural tapping mode linescan profiles similar to that illustrated in FIG. 7, where the transistor was manufactured in the same manner as for the transistor described in the context of FIG. 6 but with no pin-down anchor layer or transient anchor layer present. As illustrated the cumulative fraction of discrete carbon nanotubes at the 2.2 nm cutoff equaled about 0.1.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, it should be understood that terms of positioning and orientation (e.g., top, vertical) have been used to describe the relative positioning and orientation of components, but the components can be held in various positions or orientation (e.g., a vertical or horizontal orientation or some other orientation). Moreover, the separation of various system components in the embodiments described above should not be understood as requiring such separation in all embodiments.

Thus, particular embodiments of the invention have been described. Other embodiments are within the scope of the following claims. For example, the actions recited in the claims can be performed in a different order and still achieve desirable results.

Those skilled in the art to which this application relates will appreciate that other and further additions, deletions, substitutions and modifications may be made to the described embodiments.

What is claimed is:

1. An electrical device, comprising:
a substrate having a surface;
a radiofrequency field effect transistor on the substrate surface, the radiofrequency field effect transistor including:
a carbon nanotube (CNT) layer on the substrate surface, wherein the CNT layer includes electrically conductive aligned carbon nanotubes;
pin-down anchor layers on the CNT layer, wherein:
a first portion of the CNT layer, located in-between the pin-down anchor layers, is not covered by the pin-down anchor layers and is a channel region of the radiofrequency field effect transistor,
second portions of the CNT layer are covered by the pin-down anchor layers, and
for cross-sections in a direction perpendicular to a common alignment direction of the electrically conductive aligned carbon nanotubes in the first portion of the CNT layer:
the electrically conductive aligned carbon nanotubes have an average linear density in a range from 20 to 120 nanotubes per micron along the cross-section, and
at least 40 percent of the electrically conductive aligned carbon nanotubes are discrete from any carbon nanotubes of the CNT layer; and
the pin-down anchor layers are composed of an electrically non-conductive material; and
source and drain electrode contacts located on the substrate surface such that the source electrode contact contacts one end region of the electrically conductive aligned carbon nanotubes corresponding to one of the second portions of the CNT layer and the drain electrode contact contacts an opposite end region of a same one of the electrically conductive aligned carbon nanotubes corresponding to a remaining one of the second portions of the CNT layer.

2. The device of claim 1, wherein at least 50 percent of the electrically conductive aligned carbon nanotubes are discrete from any carbon nanotubes of the CNT layer.

3. The device of claim 1, wherein at least 70 percent of the electrically conductive aligned carbon nanotubes are discrete from any carbon nanotubes of the CNT layer.

4. The device of claim 1, wherein at least 90 percent of the electrically conductive aligned carbon nanotubes are discrete from any carbon nanotubes of the CNT layer.

5. The device of claim 1, wherein the pin-down anchor layers are separated by a distance in a range from 5 to 500 nm.

6. The device of claim 1, wherein the pin-down anchor layers are separated by a distance in a range from 100 to 400 nm.

7. The device of claim 1, wherein the pin-down anchor layers are separated by a distance in a range from 200 to 300 nm.

8. The device of claim 1, wherein the pin-down anchor layers are separated by a distance in a range from 400 to 500 nm.

9. The device of claim 1, wherein the pin-down anchor layers are composed of an electrically conductive material and serve as source and drain electrode contacts of the radiofrequency field effect transistor such that the source electrode contact contacts one end region of the electrically conductive aligned carbon nanotubes corresponding to one of the second portions of the CNT layer and the drain electrode contact contacts an opposite end region of a same one of the electrically conductive aligned carbon nanotubes corresponding to a remaining one of the second portions of the CNT layer.

10. The device of claim 9, wherein the electrically conductive material of the pin-down anchor layers include palladium, gold, platinum, yttrium, scandium, titanium, nickel, chromium, cobalt, or multilayer or alloy combinations thereof.

11. The device of claim 1, further including a gate electrode structure of the radiofrequency field effect transistor, the gate electrode structure located on a central part of the first portion of the CNT layer.

12. The device of claim 11, wherein a width of the gate electrode structure is a value in a range from 10 percent to 90 percent of a length between source and drain contacts of the device.

13. The device of claim 1, wherein the electrically non-conductive material the pin-down anchor layers include positive or negative or lift off resist materials, fluorocarbon or $SiO_2$, quartz, $Al_2O_3$, sapphire, $HfO_2$, $ZrO_2$, $Y_2O_3$, $CeO_2$, $Ta_2O_5$, $TiO_2$, $Nb_2O_5$.

14. The device of claim 1, wherein the radiofrequency field effect transistor has an on-off ratio value in a range of 5:1 to 1000:1.

15. The device of claim 1, wherein the radiofrequency field effect transistor has transconductance value in a range from 100 to 1200 mS/mm.

16. The device of claim 1, wherein the radiofrequency field effect transistor has transconductance value in a range from 100 to 250 mS/mm.

17. The device of claim 1, wherein the average linear density is in a range from 30 to 60 nanotubes per micron along the cross-section.

18. The device of claim 1, wherein the average linear density is in a range from 60 to 100 nanotubes per micron along the cross-section.

19. The device of claim 1, wherein the average linear density is in a range from 100 to 120 nanotubes per micron along the cross-section.

\* \* \* \* \*